(12) United States Patent
Oh

(10) Patent No.: US 11,488,672 B2
(45) Date of Patent: *Nov. 1, 2022

(54) SEMICONDUCTOR MEMORY DEVICE INCLUDING PAGE BUFFERS

(71) Applicant: SK hynix Inc., Icheon-si (KR)

(72) Inventor: Sung Lae Oh, Cheongju-si (KR)

(73) Assignee: SK hynix Inc., Icheon-si (KR)

( * ) Notice: Subject to any disclaimer, the term of this patent is extended or adjusted under 35 U.S.C. 154(b) by 107 days.

This patent is subject to a terminal disclaimer.

(21) Appl. No.: 16/897,061

(22) Filed: Jun. 9, 2020

(65) Prior Publication Data

US 2021/0217480 A1 Jul. 15, 2021

(51) Int. Cl.
*G11C 16/14* (2006.01)
*G11C 16/24* (2006.01)
*G11C 16/04* (2006.01)

(52) U.S. Cl.
CPC .............. *G11C 16/24* (2013.01); *G11C 16/14* (2013.01); *G11C 16/0483* (2013.01)

(58) Field of Classification Search
CPC ..... G11C 16/24; G11C 16/14; G11C 16/0483; G11C 7/106; G11C 16/08; G11C 16/16; C23C 28/048; C23C 14/0036; C23C 14/086; C23C 16/403; C23C 16/45525; H01L 29/7869; H01L 35/04; H01L 35/14
See application file for complete search history.

(56) References Cited

U.S. PATENT DOCUMENTS

| 2015/0003150 A1* | 1/2015 | Aritome ............. G11C 16/3427 |
| | | 365/185.02 |
| 2015/0055414 A1* | 2/2015 | Chen ....................... G11C 16/10 |
| | | 365/185.12 |
| 2015/0347296 A1* | 12/2015 | Kotte .................... G06F 3/0679 |
| | | 711/103 |

FOREIGN PATENT DOCUMENTS

JP 2018-152419 A 9/2018
KR 10-2015-0129940 A 11/2015

* cited by examiner

*Primary Examiner* — Jay W. Radke

(57) ABSTRACT

A semiconductor memory device includes a latch defined on a circuit chip; and a bit line select transistor defined in a first memory chip stacked in the circuit chip and a second memory chip stacked on the first memory chip. The bit line select transistors exchange data with the latch.

18 Claims, 18 Drawing Sheets

SEMICONDUCTOR MEMORY DEVICE INCLUDING PAGE BUFFERS

CROSS-REFERENCE TO RELATED APPLICATION

The present application claims priority under 35 U.S.C. § 119(a) to Korean Patent Application No. 10-2020-0004637 filed in the Korean Intellectual Property Office on Jan. 14, 2020, which is incorporated herein by reference in its entirety.

BACKGROUND

1. Technical Field

Various embodiments generally relate to a semiconductor memory device, and particularly, to a semiconductor memory device including page buffers.

2. Related Art

As the demand for portable phones, mobile memory devices and digital cameras increases, the demand for non-volatile memory devices, which are mainly used as memory devices for these products, also increases. For example, NAND flash memory devices are widely used in data storage devices with nonvolatile memory. NAND flash memory devices include a plurality of page buffers, which are coupled to bit lines, and which perform operations necessary to read and output data stored in memory cells using the page buffers.

Recently, a structure in which a plurality of memory chips are stacked on a circuit chip and defined with page buffers has been suggested as a measure for addressing the demands for large capacity and high performance in a semiconductor memory device.

SUMMARY

Various embodiments are directed to semiconductor memory devices capable of reducing differences in operation speed between stacked memory chips.

Various embodiments are also directed to semiconductor memory devices capable of improving operation speed.

In an embodiment, a semiconductor memory device may include: a latch defined on a circuit chip; and a bit line select transistor defined in a first memory chip stacked on the circuit chip; and a bit line select transistor defined in a second memory chip stacked on the circuit chip. The bit line select transistors exchange data with the latch.

In an embodiment, a semiconductor memory device may include: a bit line select transistor defined in each of a first and a second memory chip, which are stacked on a circuit chip; a through-chip interconnector traversing the first and second memory chips, and coupled in common to the bit line select transistor of the first memory chip and the bit line select transistor of the second memory chip; and a latch defined in the circuit chip and, through the through-chip interconnector, coupled to the bit line select transistor of the first memory chip and the bit line select transistor of the second memory chip.

In an embodiment, a semiconductor memory device may include: low-voltage elements of a page buffer circuit defined on a circuit chip; and high-voltage elements of the page buffer circuit defined in each of a first memory chip and a second memory chip stacked on the circuit chip.

DETAILED DESCRIPTION

Figure 1:
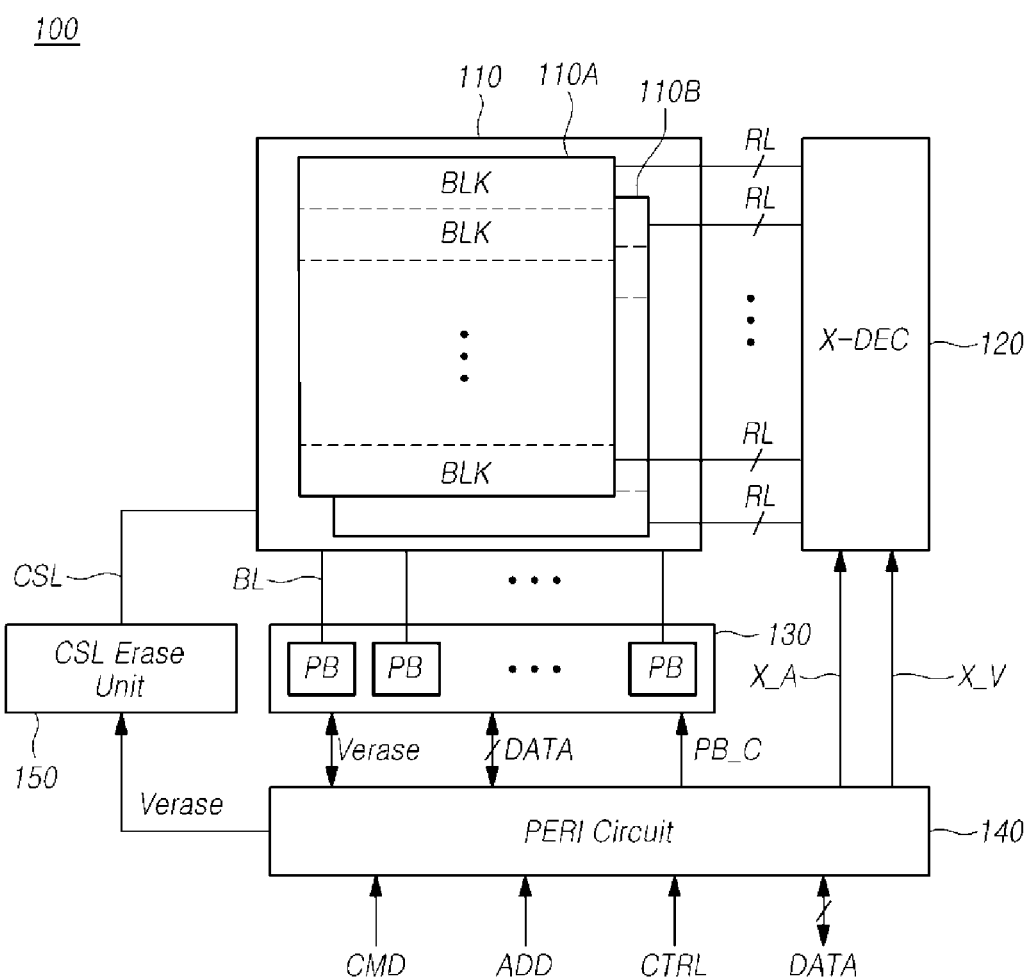
FIG. 1 is a block diagram illustrating a representation of a semiconductor memory device in accordance with an embodiment of the disclosure.

Advantages and features of the disclosure and methods to achieve them will become apparent from the descriptions of exemplary embodiments herein below and described with reference to the accompanying drawings. However, the present disclosure is not limited to the exemplary embodiments disclosed herein but may be implemented in various different ways. The exemplary embodiments of the present disclosure convey the scope of the disclosure to those skilled in the art.

The figures, dimensions, ratios, angles, numbers of elements given in the drawings that describe embodiments of the disclosure are merely illustrative and are not limiting. Throughout the specification, like reference numerals refer to like elements. In describing the disclosure, when it is determined that a detailed description of the known related art may obscure the gist or clarity of the disclosure, the detailed description thereof will be omitted. It is to be understood that the terms "comprising," "having," "including" and so on, used in the description and claims, should not be interpreted as being restricted to the means listed thereafter unless specifically stated otherwise. Where an indefinite or definite article is used when referring to a singular noun (e.g. "a," "an," "the"), the article may include a plural of that noun unless specifically stated otherwise. Elements in embodiments of the disclosure should be interpreted as including error margins even in the absence of explicit statements.

Also, in describing the components of the disclosure, there may be terms used like first, second, A, B, (a), and (b). These are solely for the purpose of differentiating one component from the other and do not to imply or suggest the substances, order, sequence or number of the components. Also, elements in embodiments of the disclosure are not limited by these terms. These terms are used to merely distinguish one element from another. Accordingly, as used herein, a first element may be a second element within the technical idea of the disclosure.

If a component is described as "connected," "coupled" or "linked" to another component, it may mean that the component is not only directly "connected," "coupled" or "linked" but also is indirectly "connected," "coupled" or "linked" via a third component. In describing positional relationship, such as "an element A on an element B," "an element A above an element B," "an element A below an element B" and "an element A next to an element B," another element C may be disposed between the elements A and B unless the term "directly" or "immediately" is explicitly used.

Features of various exemplary embodiments of the disclosure may be coupled, combined or separated partially or totally. Technically various interactions and operations are possible. Various exemplary embodiments can be practiced individually or in combination.

Hereinafter, various examples of embodiments of the disclosure will be described in detail with reference to the accompanying drawings.

FIG. 1 is a block diagram illustrating a representation of a semiconductor memory device in accordance with an embodiment of the disclosure.

Referring to FIG. 1, a semiconductor memory device 100 in accordance with an embodiment of the disclosure may include a memory cell array 110, a row decoder (X-DEC) 120, a page buffer circuit 130, a peripheral circuit (PERI circuit) 140, and a CSL erase unit 150.

The memory cell array 110 may include a first memory cell array 110A and a second memory cell array 110B. The first memory cell array 110A and the second memory cell array 110B may be defined on different memory chips. While the present embodiment illustrates a case where the memory cell array 110 is configured in two memory chips, it is to be noted that the memory cell array 110 may be configured in three or more memory chips.

Each of the first and second memory cell arrays 110A and 110B may include a plurality of memory blocks BLK. While not illustrated, each of the memory blocks BLK may include a plurality of cell strings. Each cell string may include at least one drain select transistor, a plurality of memory cells and at least one source select transistor, which are coupled in series. Each memory cell may be a volatile memory cell or may be a nonvolatile memory cell. While it will be described below that the semiconductor memory device 100 is a vertical NAND flash device, it is to be understood that the technical spirit of the disclosure is not limited thereto.

Each of the memory blocks BLK of the first and second memory cell arrays 110A and 110B may be coupled to the row decoder 120 through a plurality of row lines RL. The first and second memory cell arrays 110A and 110B may be coupled to the page buffer circuit 130 through bit lines BL.

The row decoder 120 may select any one memory block BLK, from among the memory blocks BLK included in the first and second memory cell arrays 110A and 110B, in response to a row address X_A provided from the peripheral circuit 140. The row decoder 120 may transfer an operating voltage X_V, provided from the peripheral circuit 140, to row lines RL coupled to a memory block BLK selected from among the memory blocks BLK included in the first and second memory cell arrays 110A and 110B. In order to transfer the operating voltage X_V, the row decoder 120 may include a plurality of pass transistor units (not illustrated) corresponding to the memory blocks BLK, respectively. Each pass transistor unit may include a plurality of pass transistors which are coupled to the row lines RL, respectively, of a corresponding memory block BLK. The number of pass transistor units may be equal to the sum of the number of memory blocks BLK included in the first memory cell array 110A and the number of memory blocks BLK included in the second memory cell array 110B.

An erase operation of the semiconductor memory device 100 may be performed in units of memory block BLK. When an erase voltage Verase is applied to the channels of memory cells in the erase operation, the row decoder 120 may select at least one of the memory blocks BLK in response to the row address X_A provided from the peripheral circuit 140.

The page buffer circuit 130 may include a plurality of page buffers PB, which are coupled to the bit lines BL, respectively. The page buffer circuit 130 may receive a page buffer control signal PB_C from the peripheral circuit 140, and may transmit and receive a data signal DATA to and from the peripheral circuit 140. The page buffer circuit 130 may control the bit lines BL, which are arranged in the memory cell array 110, in response to the page buffer control signal PB_C. For example, the page buffer circuit 130 may detect data, stored in a memory cell of the memory cell array 110, by sensing the signal of a bit line BL of the memory cell array 110 in response to the page buffer control signal PB_C, and may transmit the data signal DATA to the peripheral circuit 140 depending on the detected data. The page buffer circuit 130 may apply a signal to a bit line BL based on the data signal DATA received from the peripheral circuit 140 in response to the page buffer control signal PB_C, and thereby, may write data in a memory cell of the memory cell array 110. Thus, the page buffer circuit 130 may write data in or read data from memory cells that are coupled to an activated word line.

The peripheral circuit 140 may receive a command signal CMD, an address signal ADD and a control signal CTRL from outside the semiconductor memory device 100, and may transmit and receive data DATA to and from a device outside the semiconductor memory device 100, such as for example, a memory controller. The peripheral circuit 140 may output signals for writing data in the memory cell array 110 or reading data from the memory cell array 110, for example, the row address X_A, the page buffer control signal PB_C and so forth, based on the command signal CMD, the address signal ADD and the control signal CTRL. The peripheral circuit 140 may generate various voltages which are required in the semiconductor memory device 100, by using an external voltage supplied to the semiconductor memory device 100.

The peripheral circuit 140 may include a plurality of pumping capacitors (not illustrated), and may generate a plurality of voltages by selectively activating the plurality of pumping capacitors. The plurality of voltages may include the operating voltage X_V and the erase voltage Verase. In an erase operation, the peripheral circuit 140 may provide the erase voltage Verase to the page buffer circuit 130 and to the CSL erase unit 150.

The CSL erase unit 150 may be coupled to the first and second memory cell arrays 110A and 110B through a common source line CSL. The CSL erase unit 150 may couple the erase voltage Verase, provided from the peripheral circuit 140, to the common source line CSL in an erase operation, and accordingly, may transfer the erase voltage Verase to the channels of the memory cells of the first and second memory cell arrays 110A and 110B.

Herein below, in the accompanying drawings, a direction in which memory chips are stacked is defined as a first direction FD, an arrangement direction of bit lines is defined as a second direction SD, and an extending direction of the bit lines is defined as a third direction TD. The second direction SD and the third direction TD may intersect substantially perpendicularly with each other. The first direction FD may correspond to a direction that is perpendicular to the second direction SD and the third direction TD. In the following descriptions, the term 'vertical' or 'vertical direction' will be used as substantially the same meaning as the first direction FD. In the drawings, a direction indicated by an arrow and a direction opposite thereto represents the same direction.

Figure 2:
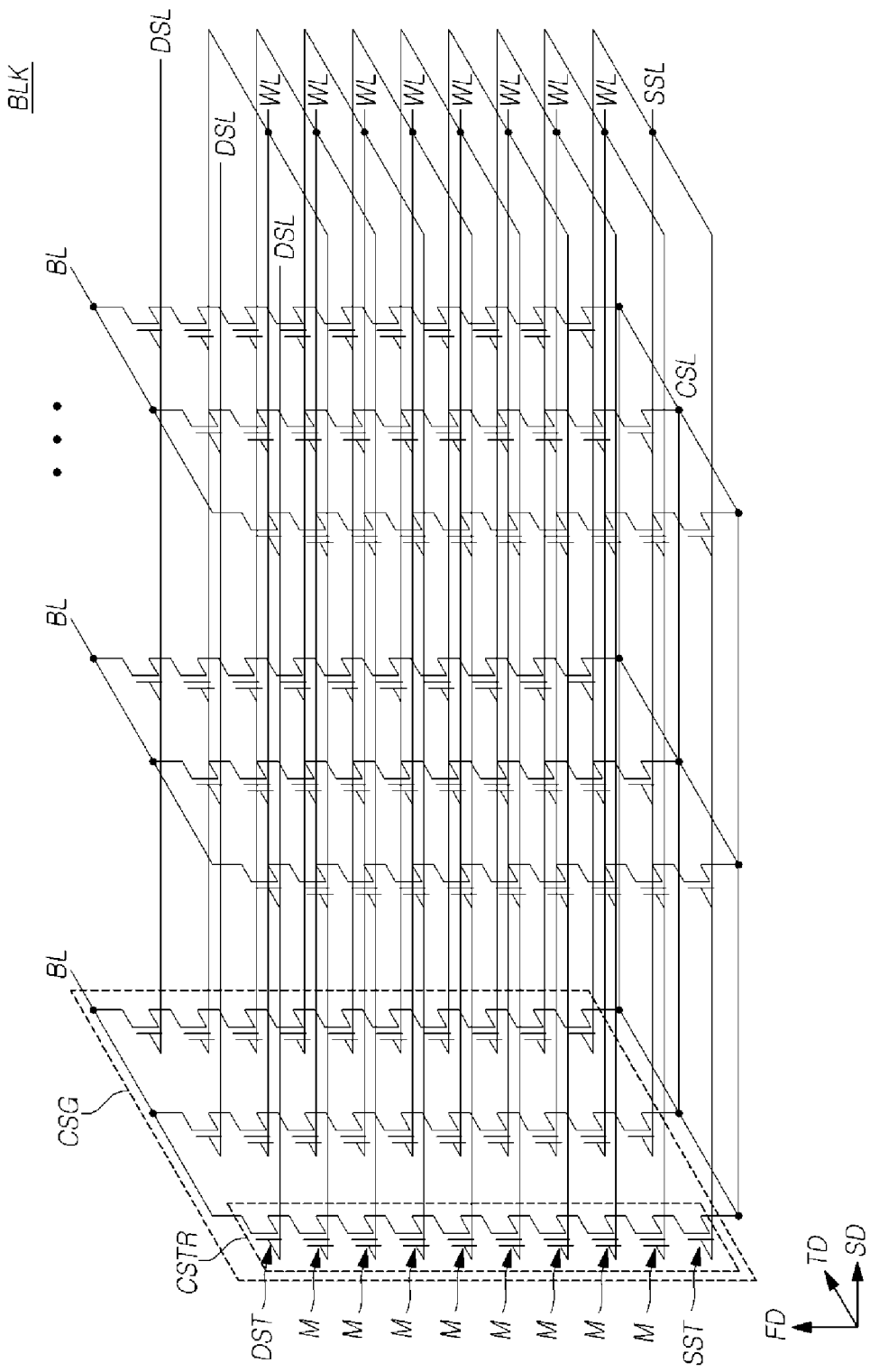
FIG. 2 is an equivalent circuit diagram illustrating a representation of one of memory blocks illustrated in FIG. 1.

FIG. 2 is an equivalent circuit diagram illustrating an example of one of the memory blocks BLK illustrated in FIG. 1.

Referring to FIG. 2, a memory block BLK may include a plurality of cell strings CSTR, corresponding to a plurality of bit lines BL, and a common source line CSL.

The bit lines BL may extend in the third direction TD and be arranged in the second direction SD. A plurality of cell strings CSTR may be coupled in parallel to each of the bit lines BL. The cell strings CSTR may be coupled in common to the common source line CSL. The plurality of cell strings CSTR may be coupled between the plurality of bit lines BL and the one common source line CSL.

Each of the cell strings CSTR may include a drain select transistor DST that is coupled to a bit line BL, a source select transistor SST that is coupled to the common source line CSL, and a plurality of memory cells M, which are coupled between the drain select transistor DST and the source select transistor SST. The drain select transistor DST, the memory cells M and the source select transistor SST may be coupled in series in the first direction FD.

Drain select lines DSL, a plurality of word lines WL and a source select line SSL may be disposed between the bit lines BL and the common source line CSL in the first direction FD. Each of the drain select lines DSL may be coupled to the gates of corresponding drain select transistors DST. Each of the word lines WL may be coupled to the gates of corresponding memory cells M. The source select line SSL may be coupled to the gates of source select transistors SST. Memory cells M that are coupled in common to one word line WL may configure one page. The semiconductor memory device 100 may perform program operations and read operations in page units. Cell strings CSTR, which are coupled in common to one bit line BL, may configure one cell string group CSG.

Figure 3A:
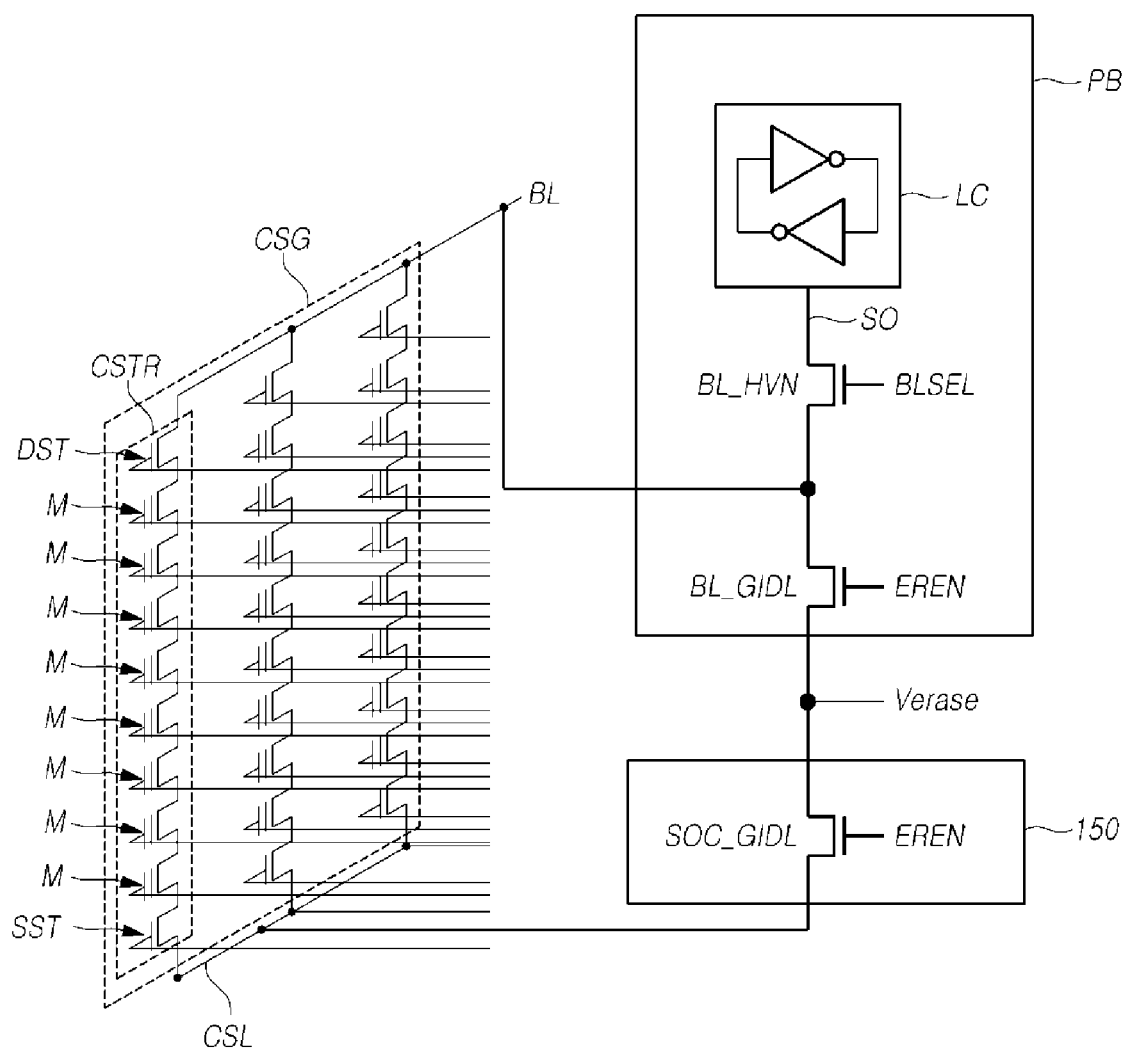
FIGS. 3A and 3B are circuit diagrams illustrating representations of a page buffer and a CSL erase unit in accordance with embodiments of the disclosure.
Figure 3B:
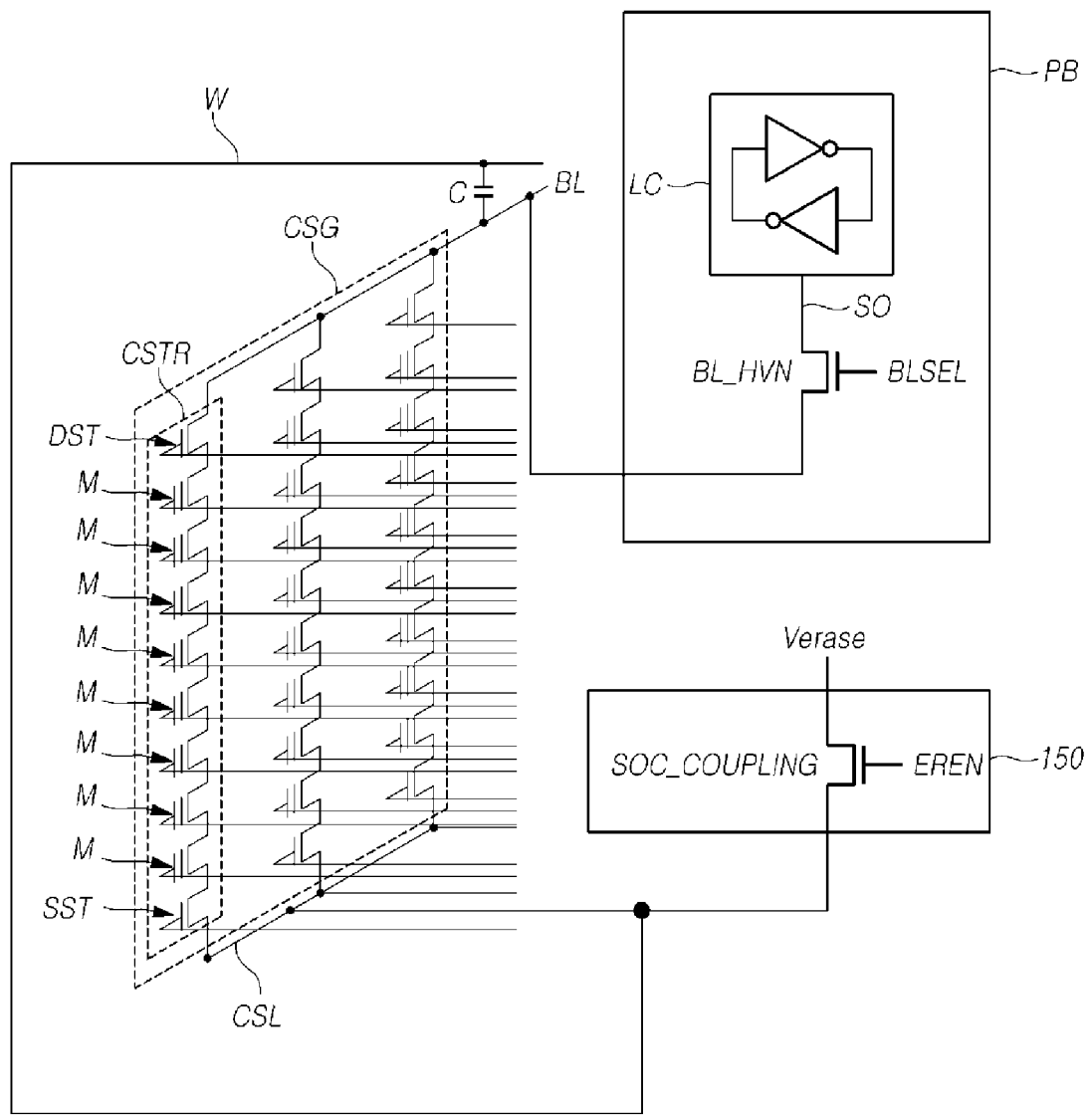

FIGS. 3A and 3B are circuit diagrams illustrating representations of a page buffer PB and a CSL erase unit 150 in accordance with embodiments of the disclosure.

Referring to FIG. 3A, the page buffer PB may be coupled to a cell string group CSG through a bit line BL. The page buffer PB may include a latch LC, a bit line select transistor BL_HVN, and a first erase voltage pass transistor BL_GIDL.

The CSL erase unit 150 may be coupled to the cell string group CSG through a common source line CSL. The CSL erase unit 150 may include a second erase voltage pass transistor SOC_GIDL. A page buffer PB may be provided for each bit line BL. The CSL erase unit 150 may be provided for each of a first memory cell array (110A of FIG. 1) and a second memory cell array (110B of FIG. 1).

The bit line select transistor BL_HVN may be coupled between the bit line BL and a sensing line SO, and may operate in response to a bit line select signal BLSEL. If the bit line select signal BLSEL is activated, the bit line select transistor BL_HVN may couple the bit line BL and the sensing line SO. If the bit line select signal BLSEL is deactivated, the bit line select transistor BL_HVN may decouple the bit line BL and the sensing line SO.

The latch LC may apply a voltage to the sensing line SO based on data stored therein. The voltage applied to the sensing line SO may be transferred to the bit line BL through the bit line select transistor BL_HVN. The latch LC may perform a latch based on the voltage of the sensing line SO. The latch may be performed based on the voltage transferred from the bit line BL to the sensing line SO through the bit line select transistor BL_HVN.

The first erase voltage pass transistor BL_GIDL may be coupled between an erase voltage Verase and the bit line BL, and may operate in response to an erase enable signal EREN. If the erase enable signal EREN is activated, then the first erase voltage pass transistor BL_GIDL may couple the erase voltage Verase and the bit line BL, and accordingly, the erase voltage Verase may be applied to the channels of memory cells through the bit line BL. If the erase enable signal EREN is deactivated, then the first erase voltage pass transistor BL_GIDL may decouple the erase voltage Verase and the bit line BL.

The second erase voltage pass transistor SOC_GIDL may be coupled between the erase voltage Verase and the common source line CSL, and may operate in response to an erase enable signal EREN. If the erase enable signal EREN is activated, then the second erase voltage pass transistor SOC_GIDL may couple the erase voltage Verase and the common source line CSL, and accordingly, the erase voltage Verase may be applied to the channels of the memory cells through the common source line CSL. If the erase enable signal EREN is deactivated, then the second erase voltage pass transistor SOC_GIDL may decouple the erase voltage Verase and the common source line CSL.

In an erase operation, the bit line select signal BLSEL may be deactivated, and the erase enable signal EREN may be activated. If the erase enable signal EREN is activated, then the first and second erase voltage pass transistors BL_GIDL and SOC_GIDL may be turned on, and thereby, the erase voltage Verase having a relatively high level may be applied to the bit line select transistor BL_HVN and the first and second erase voltage pass transistors BL_GIDL and SOC_GIDL. In order to withstand the erase voltage Verase having a relatively high level, the bit line select transistor BL_HVN and the first and second erase voltage pass transistors BL_GIDL and SOC_GIDL may be configured by high-voltage transistors. If the bit line select signal BLSEL is deactivated in the erase operation, then the bit line select transistor BL_HVN may be turned off, and thereby, the erase voltage Verase may not be transferred to the latch LC. Therefore, the latch LC may be configured by low-voltage transistors. The first erase voltage pass transistor BL_GIDL and the second erase voltage pass transistor SOC_GIDL may be included in an erase circuit. In the erase operation, the erase circuit may be interconnected to at least one of the bit line BL and the common source line CSL to transfer the erase voltage Verase to at least one of the bit line BL and the common source line CSL.

Referring to FIG. 3B, a page buffer PB is illustrated that does not include a first erase voltage pass transistor (BL_GIDL of FIG. 3A). The page buffer PB may include a bit line select transistor BL_HVN and a latch LC.

The CSL erase unit 150 may include a third erase voltage pass transistor SOC_COUPLING. One terminal of the third erase voltage pass transistor SOC_COUPLING may be coupled to an erase voltage Verase, and the other terminal of the third erase voltage pass transistor SOC_COUPLING may be coupled in common to a common source line CSL and a wiring line W.

The wiring line W may overlap with a bit line BL. A dielectric layer (not illustrated) may be disposed between the wiring line W and the bit line BL. In the overlapping portion between the wiring line W and the bit line BL, a coupling capacitor C may be disposed, including a first electrode configured by the wiring line W, a second electrode configured by the bit line BL and a dielectric layer configured by an insulating film between the wiring line W and the bit line BL.

If an erase enable signal EREN is activated in an erase operation, then the third erase voltage pass transistor SOC_COUPLING may be turned on to couple the erase voltage Verase to the common source line CSL and the wiring line W. As a result, the erase voltage Verase may be transferred to channels of memory cells through the common source line CSL. In addition, due to the presence of the coupling capacitor C, the potential of the bit line BL may be boosted by following the erase voltage Verase applied to the wiring line W, and a boosted voltage may be transferred to the channels of the memory cells. If the erase enable signal EREN is deactivated, then the third erase voltage pass transistor SOC_COUPLING may be turned off, and thereby, the erase voltage Verase may be decoupled from the common source line CSL and the wiring line W. The third erase voltage pass transistor SOC_COUPLING may be included in an erase circuit. The erase circuit may be interconnected to at least one of the bit line BL and the common source line CSL to transfer the erase voltage Verase to at least one of the bit line BL and the common source line CSL in an erase operation.

Figure 4:
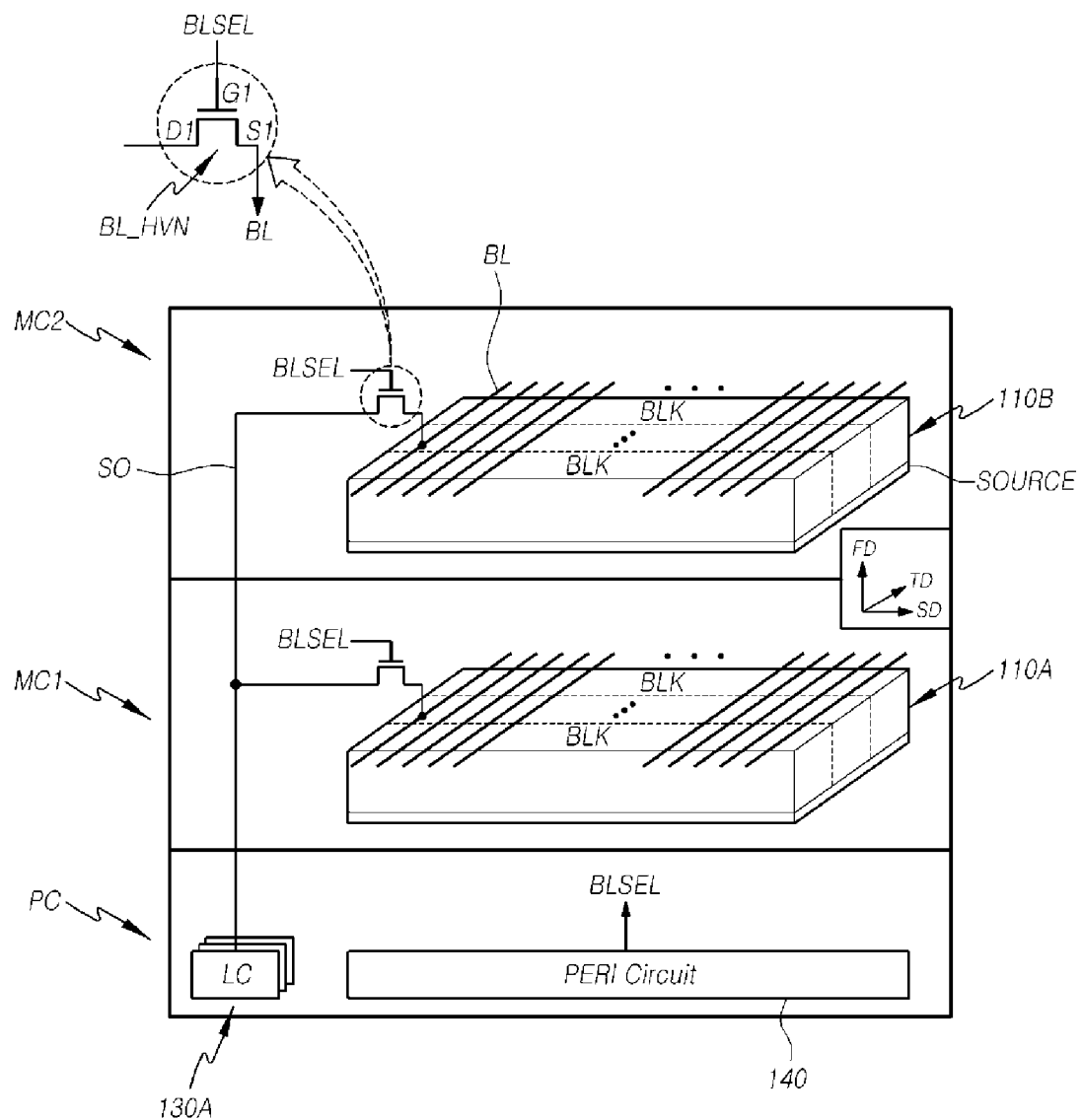
FIGS. 4 to 10 are diagrams schematically illustrating representations of semiconductor memory devices in accordance with embodiments of the disclosure.

FIG. 4 is a diagram illustrating a representation of a semiconductor memory device in accordance with an embodiment of the disclosure.

Referring to FIG. 4, a semiconductor memory device in accordance with an embodiment of the disclosure may include a circuit chip PC, and first and second memory chips MC1 and MC2, which are stacked on the circuit chip PC in the first direction FD. While embodiments disclosed herein illustrate cases in which two memory chips are stacked, it is to be noted that the number of stacked memory chips are not limited, and may number three or more.

The first memory chip MC1 may include a first memory cell array 110A, and the second memory chip MC2 may include a second memory cell array 110B. The first memory cell array 110A and the second memory cell array 110B may configure the memory cell array 110 illustrated in FIG. 1.

Each of the first memory cell array 110A and the second memory cell array 110B may include a source plate SOURCE, a plurality of memory blocks BLK, which are defined on the source plate SOURCE, and a plurality of bit lines BL. Each of the memory blocks BLK may include a plurality of cell strings. The cell strings may be coupled between the bit lines BL and the source plate SOURCE. In each of the first and second memory chips MC1 and MC2, the bit lines BL may be coupled in common to the plurality of memory blocks BLK.

A bit line select transistor BL_HVN may be defined in each of the first and second memory chips MC1 and MC2. A source S1 of the bit line select transistor BL_HVN defined in the first memory chip MC1 may be coupled to one of the bit lines BL of the first memory chip MC1. A source S1 of the bit line select transistor BL_HVN defined in the second memory chip MC2 may be coupled to one of the bit lines BL of the second memory chip MC2. While FIG. 4 illustrates, for the sake of simplicity in illustration, only one bit line select transistor BL_HVN in each of the first and second memory chips MC1 and MC2, it is to be understood that a plurality of bit line select transistors BL_HVN, which are coupled respectively to the plurality of bit lines BL, are defined in each of the first and second memory chips MC1 and MC2.

A latch circuit 130A and a peripheral circuit 140 may be defined in the circuit chip PC. The latch circuit 130A may be defined as a group of latches LC that are included in the page buffers PB configuring the page buffer circuit 130 of FIG. 1.

A drain D1 of the bit line select transistor BL_HVN of the first memory chip MC1 and a drain D1 of the bit line select transistor BL_HVN of the second memory chip MC2 may be coupled in common to one sensing line SO, and may be coupled to the latch LC defined in the circuit chip PC through the one sensing line SO. The bit line select transistor BL_HVN of the first memory chip MC1 and the bit line select transistor BL_HVN of the second memory chip MC2 may be coupled in common to one latch LC, and thereby, may exchange data with the latch LC.

A bit line select signal BLSEL may be provided to a gate G1 of the bit line select transistor BL_HVN defined in the first memory chip MC1 and a gate G1 of the bit line select transistor BL_HVN defined in the second memory chip MC2 from the peripheral circuit 140. The bit line select transistor BL_HVN of the first memory chip MC1 and the bit line select transistor BL_HVN of the second memory chip MC2 may operate in response to the bit line select signal BLSEL. If the bit line select signal BLSEL is activated, then corresponding bit line select transistor BL_HVN coupled to the bit line BL of the first memory chip MC1 and the bit line select transistor BL_HVN coupled to the bit line BL of the second memory chip MC2 may be simultaneously turned on, and as a result, the bit line BL of the first memory chip MC1 and the bit line BL of the second memory chip MC2 may be coupled to the sensing line SO.

If the bit line select signal BLSEL is deactivated, then the bit line select transistor BL_HVN of the first memory chip MC1 and the bit line select transistor BL_HVN of the second memory chip MC2 may be simultaneously turned off, and consequently, the bit line BL of the first memory chip MC1 and the bit line BL of the second memory chip MC2 may be decoupled from the sensing line SO.

Figure 5:
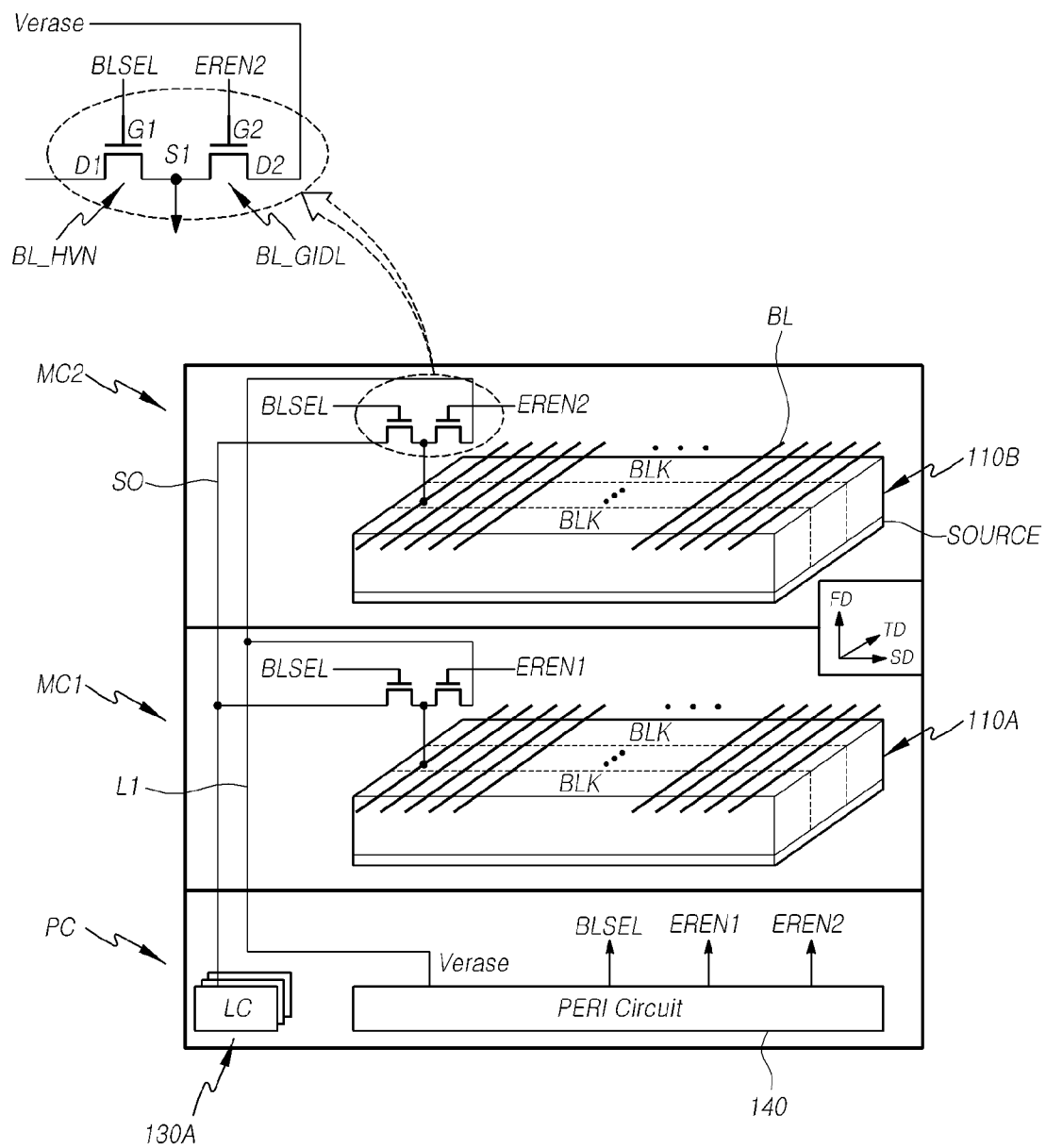

FIG. 5 is a diagram illustrating a representation of a semiconductor memory device in accordance with an embodiment of the disclosure. For the sake of simplicity in explanation, descriptions of components that are the same as those of FIG. 4 will be omitted, and only differences will be described.

Referring to FIG. 5, a first erase voltage pass transistor BL_GIDL may be defined in each of first and second memory chips MC1 and MC2. The first erase voltage pass transistor BL_GIDL, which is defined in the first memory chip MC1, may be coupled to one of bit lines BL of the first memory chip MC1 to transfer an erase voltage Verase to the bit line BL in an erase operation. The first erase voltage pass transistor BL_GIDL, which is defined in the second memory chip MC2, may be coupled to one of bit lines BL of the second memory chip MC2 to transfer the erase voltage Verase to the bit line BL in an erase operation. While FIG. 5 illustrates, for the sake of simplicity in illustration, only one first erase voltage pass transistor BL_GIDL in each of the first and second memory chips MC1 and MC2, it is to be understood that a plurality of first erase voltage pass transistors BL_GIDL, which are respectively coupled to a plurality of bit lines BL, may be included in each of the first and second memory chips MC1 and MC2.

In each of the first and second memory chips MC1 and MC2, a bit line select transistor BL_HVN and a first erase voltage pass transistor BL_GIDL may share a source S1, and a bit line BL may be coupled to the shared source S1.

A drain D2 of the first erase voltage pass transistor BL_GIDL of the first memory chip MC1 and a drain D2 of the first erase voltage pass transistor BL_GIDL of the second memory chip MC2 may be coupled in common to a line L1, and may be coupled to a peripheral circuit 140 through the line L1, which may provide an erase voltage Verase from the peripheral circuit 140. The drain D2, of the first erase voltage pass transistor BL_GIDL of the first memory chip MC1, may be coupled in common to the drain D2 of the first erase voltage pass transistor BL_GIDL of the second memory chip MC2, and thereby, may share the line L1.

A first erase enable signal EREN1 may be provided to a gate G2 of the first erase voltage pass transistors BL_GIDL defined in the first memory chip MC1 from the peripheral circuit 140, and a second erase enable signal EREN2 may be provided to a gate G2 of the first erase voltage pass transistors BL_GIDL defined in the second memory chip MC2 from the peripheral circuit 140. The first erase voltage pass transistors BL_GIDL of the first memory chip MC1 may operate in response to the first erase enable signal EREN1, and the first erase voltage pass transistors BL_GIDL of the second memory chip MC2 may operate in response to the second erase enable signal EREN2. In an erase operation, the first erase voltage pass transistors BL_GIDL of the first memory chip MC1 and the first erase voltage pass transistors BL_GIDL of the second memory chip MC2 may be independently controlled to be turned on or off. As a result erase voltage Verase may be applied to the bit lines BL of a memory chip including a selected memory block, and not applied to the bit lines BL of a memory chip not including the selected memory block.

For instance, in an erase operation, when a memory block included in the first memory chip MC1 is selected, and a memory block included in the second memory chip MC2 is not selected, the first erase enable signal EREN1 may be activated and the second erase enable signal EREN2 may be deactivated. Thus, the first erase voltage pass transistors BL_GIDL of the first memory chip MC1 may be turned on and the first erase voltage pass transistors BL_GIDL of the second memory chip MC2 may be turned off. In addition, the erase voltage Verase may be applied to the bit lines BL of the first memory chip MC1 and may not be applied to the bit lines BL of the second memory chip MC2. Further, the erase voltage Verase may be applied to a source plate SOURCE of the first memory chip MC1.

In an erase operation, an erase operation voltage of 0V may be applied to word lines of a memory block BLK selected from among the memory blocks BLK of the first memory chip MC1, and the erase operation voltage of 0V may be applied to drain select lines and source select lines to turn off drain select transistors and source select transistors. If the erase voltage Verase is applied to the bit lines BL and the source plate SOURCE when the drain select transistors and the source select transistors are turned off, the potentials of the bit lines BL and the source plate SOURCE rise, and leakage current flows between drains and bulks or other structures. Consequently, gate-induced drain leakage (GIDL) flows in a channel direction, and hot holes generated in the drain select transistors and the source select transistors are introduced in the channel direction, and the potentials of the channels rise. Therefore, as the difference between the potentials of 0V of the word lines of the selected memory block BLK and the potentials of the channels becomes equal to or larger than a magnitude necessary for the erasure of memory cells, the memory cells of the selected memory block BLK are erased.

In an erase operation, word lines, drain select lines and source select lines of a memory block BLK, which is not selected among the memory blocks BLK of the first memory chip MC1, are floated. If the erase voltage Verase is applied to the bit lines BL and the source plate SOURCE, and the potentials of the bit lines BL and the source plate SOURCE rise, then the potentials of the channels rise according to the potentials of the bit lines BL and the source plate SOURCE. From the resulting coupling phenomenon, the potentials of the word lines, the drain select lines and the source select lines which are in a floating state rise according to the potentials of the channels. Therefore, because the difference in potential between the word lines and the channels of the unselected memory block BLK is kept below the magnitude necessary for the erasure of memory cells, the memory cells of the unselected memory block BLK are not erased.

Since the erase voltage Verase is not applied to the bit lines BL of the second memory chip MC2, the memory blocks BLK of the second memory chip MC2 are not erased.

Figure 6:
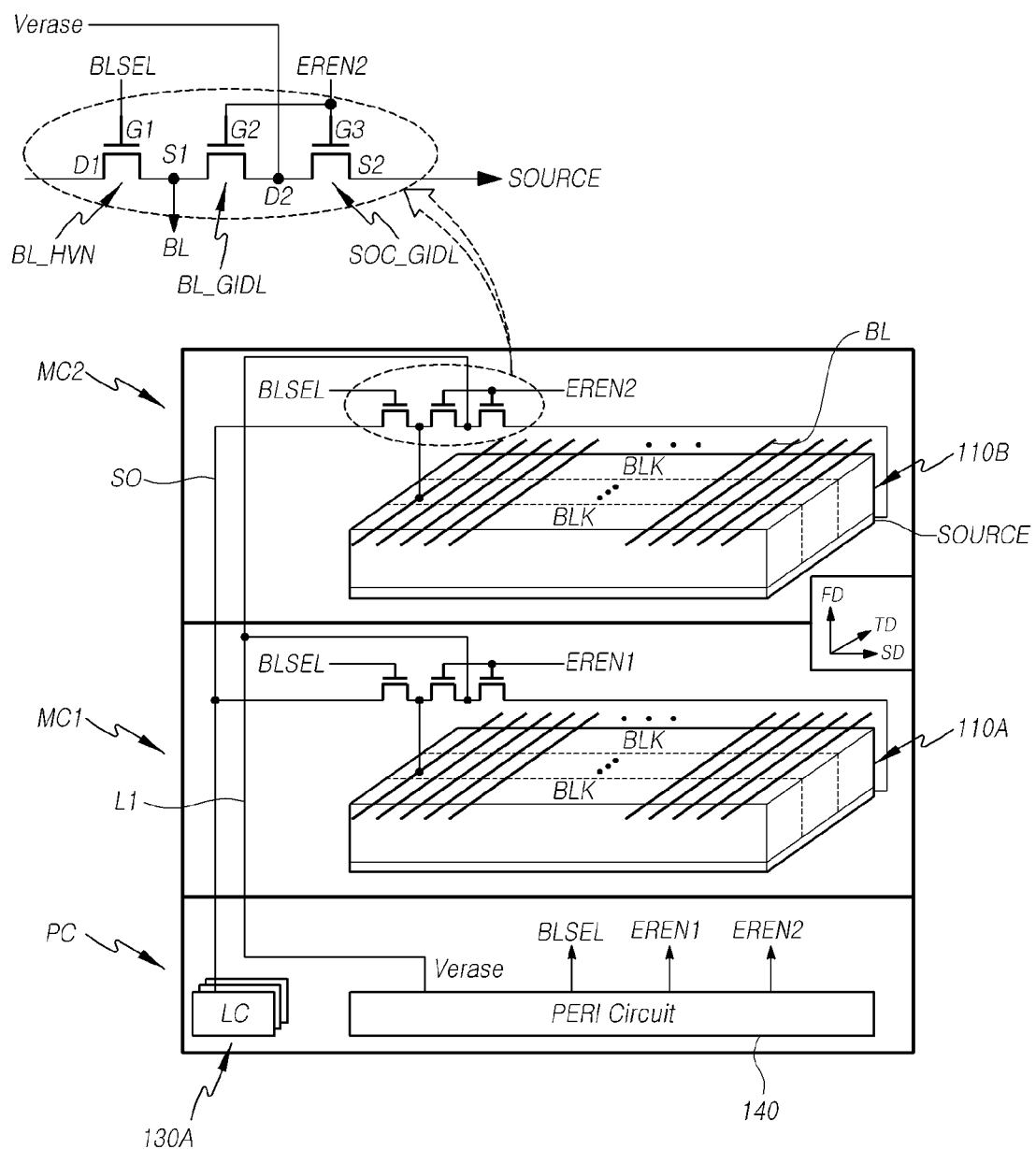

FIG. 6 is a diagram illustrating a representation of a semiconductor memory device in accordance with an embodiment of the disclosure. For the sake of simplicity in explanation, descriptions of components that are the same as those of FIGS. 4 and 5 will be omitted herein, and only differences will be described.

Referring to FIG. 6, a second erase voltage pass transistor SOC_GIDL may be defined in each of first and second memory chips MC1 and MC2. The second erase voltage pass transistor SOC_GIDL, which is defined in the first memory chip MC1, may be coupled to a source plate SOURCE of the first memory chip MC1, and may transfer an erase voltage Verase to the source plate SOURCE of the first memory chip MC1 in an erase operation. The second erase voltage pass transistor SOC_GIDL, which is defined in the second memory chip MC2, may be coupled to a source plate SOURCE of the second memory chip MC2, and may transfer the erase voltage Verase to the source plate SOURCE of the second memory chip MC2 in an erase operation.

In each of the first and second memory chips MC1 and MC2, a first erase voltage pass transistor BL_GIDL and the second erase voltage pass transistor SOC_GIDL may share a drain D2, and the erase voltage Verase may be coupled to the shared drain D2.

The drain D2 of the second erase voltage pass transistor SOC_GIDL of the first memory chip MC1 and the drain D2 of the second erase voltage pass transistor SOC_GIDL of the second memory chip MC2 may be coupled in common to a line L1, and may be coupled to a peripheral circuit 140 through the line L1, which may provide an erase voltage Verase from the peripheral circuit 140. The drain D2, of the second erase voltage pass transistor SOC_GIDL of the first memory chip MC1, may be coupled in common to the drain D2 of the second erase voltage pass transistor SOC_GIDL of the second memory chip MC2, and thereby, may share the line L1.

A first erase enable signal EREN1 may be provided to a gate G2 of the first erase voltage pass transistor BL_GIDL and a gate G3 of the second erase voltage pass transistor SOC_GIDL defined in the first memory chip MC1 from the peripheral circuit 140. A second erase enable signal EREN2 may be provided to a gate G2 of the first erase voltage pass transistor BL_GIDL and a gate G3 of the second erase voltage pass transistor SOC_GIDL defined in the second memory chip MC2 from the peripheral circuit 140. The first erase voltage pass transistor BL_GIDL and the second erase voltage pass transistor SOC_GIDL of the first memory chip MC1 may operate in response to the first erase enable signal EREN1, and the first erase voltage pass transistor BL_GIDL and the second erase voltage pass transistor SOC_GIDL of the second memory chip MC2 may operate in response to the second erase enable signal EREN2.

In an erase operation, the first and second erase voltage pass transistors BL_GIDL and SOC_GIDL of the first memory chip MC1, and the first and second erase voltage pass transistors BL_GIDL and SOC_GIDL of the second memory chip MC2, may be controlled independently to be turned on or off. Consequently, erase voltage Verase may be applied to the bit lines BL and the source plate SOURCE of a memory chip including a selected memory block, and not applied to the bit lines BL and the source plate SOURCE of a memory chip not including the selected memory block.

For example, in an erase operation, in the case where a memory block included in the first memory chip MC1 is selected, and a memory block included in the second memory chip MC2 is not selected, the first erase enable signal EREN1 may be activated and the second erase enable signal EREN2 may be deactivated. Accordingly, the erase voltage Verase may be applied to the bit lines BL and the source plate SOURCE of the first memory chip MC1, and not be applied to the bit lines BL and the source plate SOURCE of the second memory chip MC2.

Figure 7:
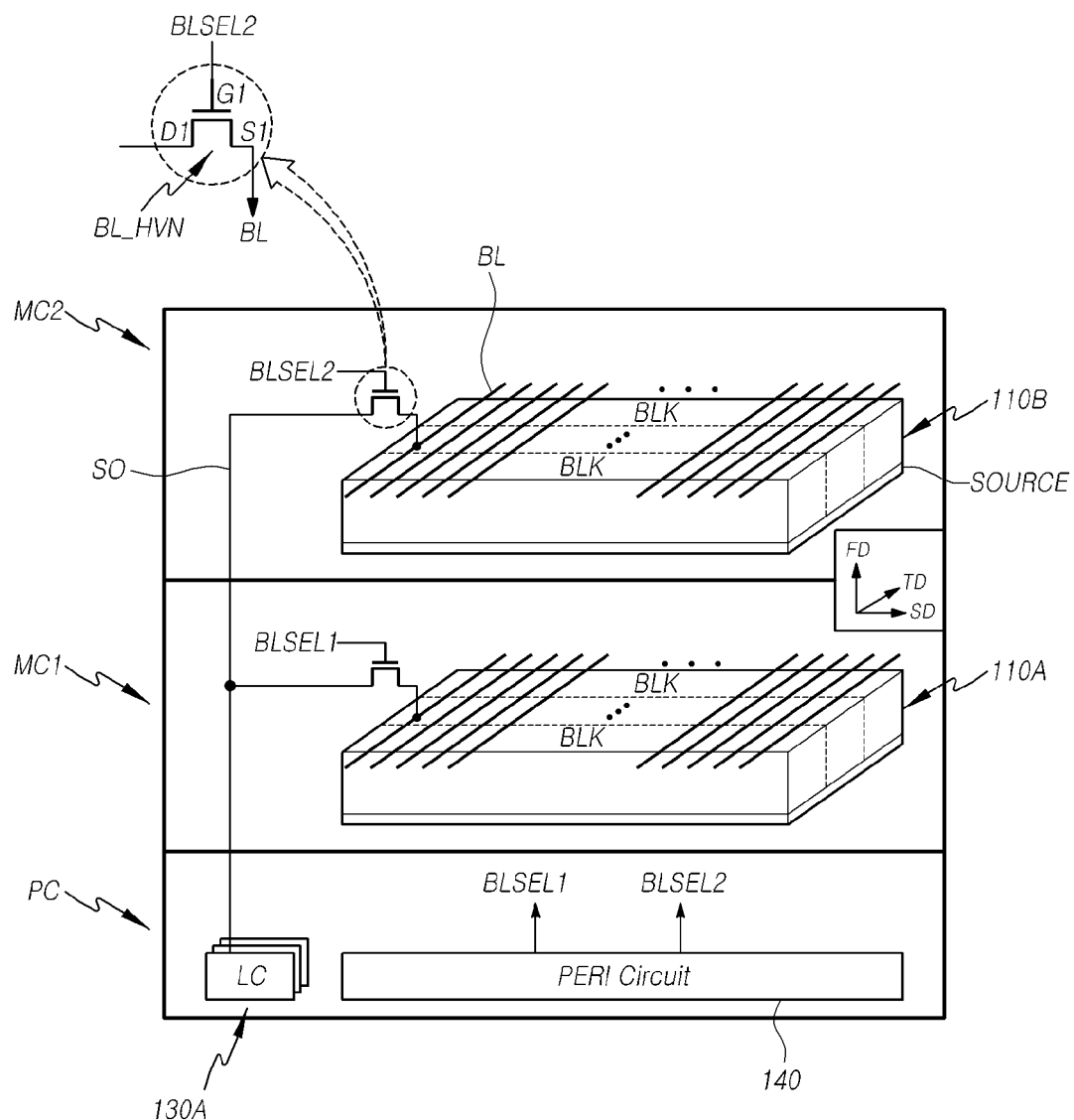

FIG. 7 is a diagram illustrating a representation of a semiconductor memory device in accordance with an embodiment of the disclosure. For the sake of simplicity in explanation, descriptions of components that the same as those of FIG. 4 will be omitted herein and only differences will be described.

Referring to FIG. 7, a first bit line select signal BLSEL1 may be provided to a first memory chip MC1 from a peripheral circuit 140, and a second bit line select signal BLSEL2 may be provided to a second memory chip MC2 from the peripheral circuit 140.

Bit line select transistors BL_HVN of the first memory chip MC1 may operate in response to the first bit line select signal BLSEL1, and bit line select transistors BL_HVN of the second memory chip MC2 may operate in response to the second bit line select signal BLSEL2.

The first bit line select signal BLSEL1 and the second bit line select signal BLSEL2 may be selectively activated. For instance, in the case of programming or reading a page of the first memory chip MC1, the first bit line select signal BLSEL1 may be activated, and the second bit line select signal BLSEL2 may be deactivated. Accordingly, the bit line select transistor BL_HVN of the first memory chip MC1 may be turned on and the bit line select transistor BL_HVN of the second memory chip MC2 may be turned off, and thereby, the bit line BL of the first memory chip MC1 may be coupled to a sensing line SO and the bit line BL of the second memory chip MC2 may be decoupled from the sensing line SO.

Figure 8:
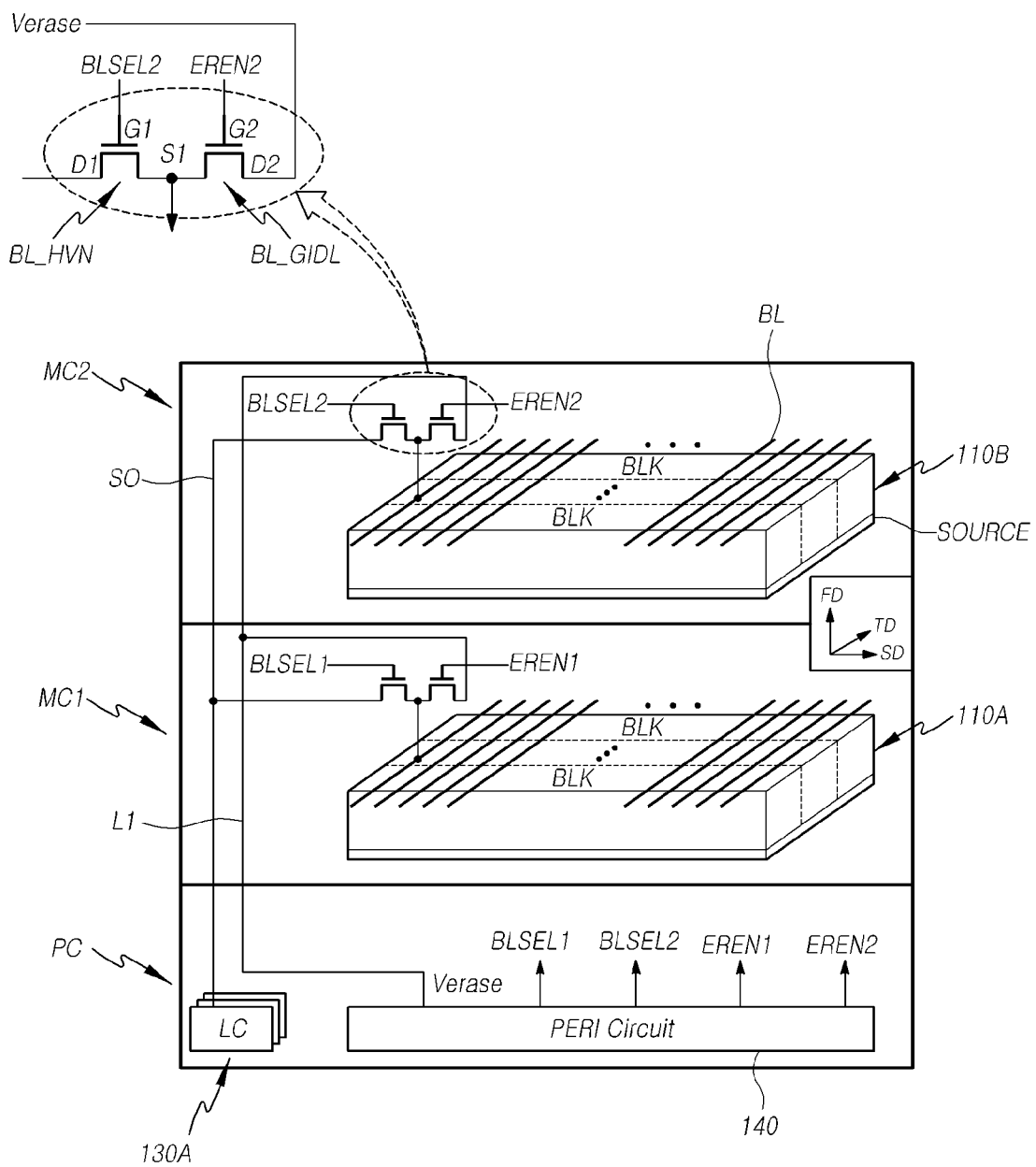

FIG. 8 is a diagram illustrating a representation of a semiconductor memory device in accordance with an embodiment of the disclosure. For the sake of simplicity in explanation, descriptions of components that are the same as those of FIGS. 4-5 will be omitted, and only differences will be described.

Referring to FIG. 8, a first erase voltage pass transistor BL_GIDL may be defined in each of first and second memory chips MC1 and MC2. The first erase voltage pass transistor BL_GIDL, which is defined in the first memory chip MC1, may be coupled to one of bit lines BL of the first memory chip MC1 to transfer an erase voltage Verase to the bit line BL in an erase operation. The first erase voltage pass transistor BL_GIDL, which is defined in the second memory chip MC2, may be coupled to one of bit lines BL of the second memory chip MC2 to transfer the erase voltage Verase to the bit line BL in an erase operation. While FIG. 8 illustrates, for the sake of simplicity in illustration, only one first erase voltage pass transistor BL_GIDL in each of the first and second memory chips MC1 and MC2, it is to be understood that a plurality of first erase voltage pass transistors BL_GIDL, which are respectively coupled to a plurality of bit lines BL, may be included in each of the first and second memory chips MC1 and MC2.

A drain D2 of the first erase voltage pass transistor BL_GIDL of the first memory chip MC1 and a drain D2 of the first erase voltage pass transistor BL_GIDL of the second memory chip MC2 may be coupled in common to a line L1, and may each be coupled to a peripheral circuit 140 through the line L1 and provided with the erase voltage Verase from the peripheral circuit 140. The drain D2 of the first erase voltage pass transistor BL_GIDL of the first memory chip MC1 and the drain D2 of the first erase voltage pass transistor BL_GIDL of the second memory chip MC2 may be coupled in common, and thereby, may share the line L1.

A first erase enable signal EREN1 may be provided to the first memory chip MC1 from the peripheral circuit 140, and a second erase enable signal EREN2 may be provided to the second memory chip MC2 from the peripheral circuit 140. The first erase voltage pass transistors BL_GIDL of the first memory chip MC1 may operate in response to the first erase enable signal EREN1, and the first erase voltage pass transistors BL_GIDL of the second memory chip MC2 may operate in response to the second erase enable signal EREN2. In an erase operation, the first erase voltage pass transistors BL_GIDL of the first memory chip MC1 and the first erase voltage pass transistors BL_GIDL of the second memory chip MC2 may be independently controlled to be turned on or off. Accordingly, the erase voltage Verase is applied to the bit lines BL of a memory chip including a selected memory block, and not applied to the bit lines BL of a memory chip not including the selected memory block.

For instance, in an erase operation, when a memory block included in the first memory chip MC1 is selected, and a memory block included in the second memory chip MC2 is not selected, the first erase enable signal EREN1 may be activated and the second erase enable signal EREN2 may be deactivated. As a result, the first erase voltage pass transistors BL_GIDL of the first memory chip MC1 may be turned on and the first erase voltage pass transistors BL_GIDL of the second memory chip MC2 may be turned off. Thus, the erase voltage Verase may be applied to the bit lines BL of the first memory chip MC1 and may not be applied to the bit lines BL of the second memory chip MC2.

Figure 9:
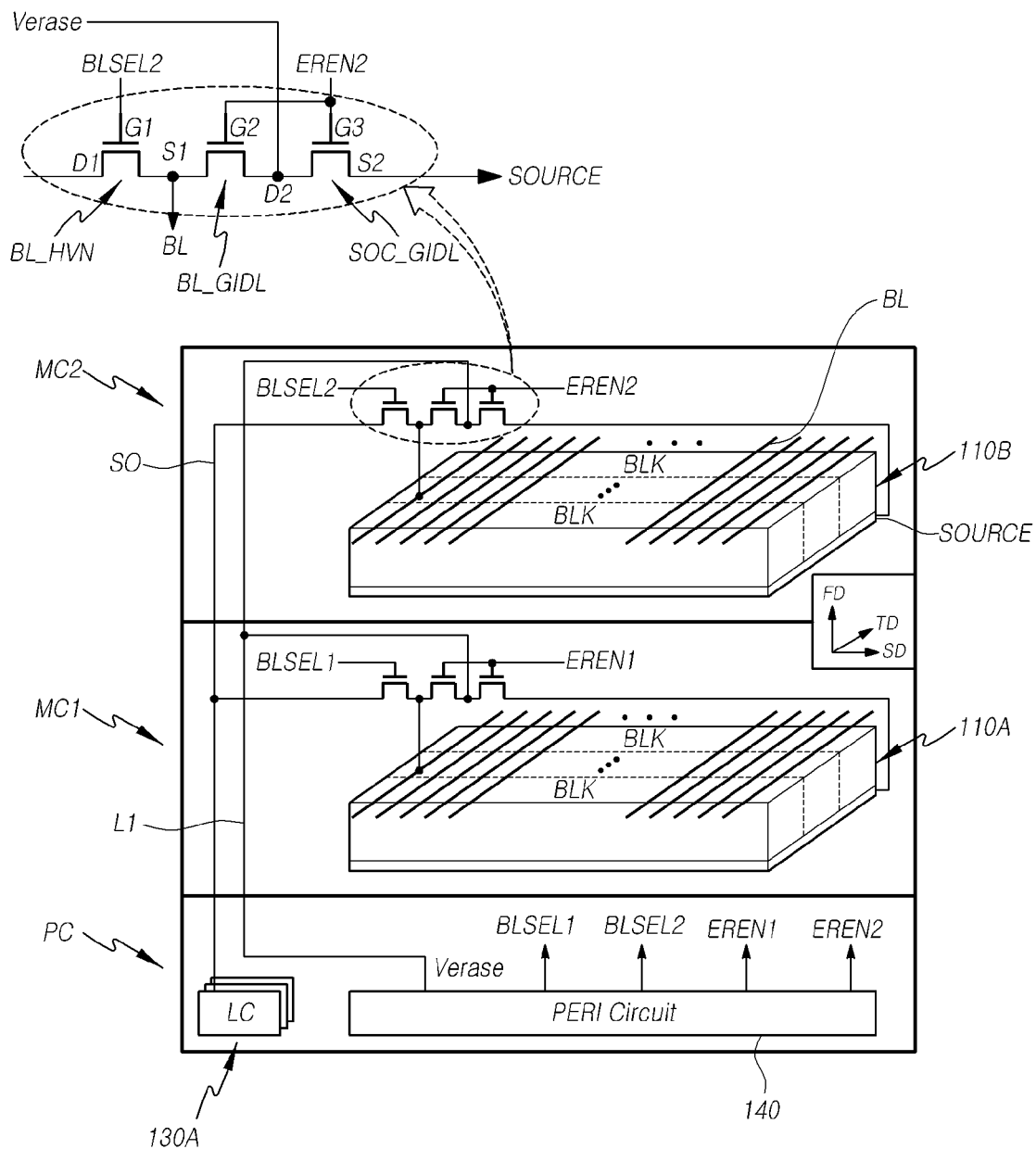

FIG. 9 is a diagram illustrating a representation of a semiconductor memory device in accordance with an embodiment of the disclosure. For the sake of simplicity in explanation, descriptions of components that are the same as those of FIGS. 4-6 will be omitted herein, and only differences will be described.

Referring to FIG. 9, a second erase voltage pass transistor SOC_GIDL may be defined in each of first and second memory chips MC1 and MC2. The second erase voltage pass transistor SOC_GIDL, which is defined in the first memory chip MC1, may be coupled to a source plate SOURCE of the first memory chip MC1, and may transfer an erase voltage Verase to the source plate SOURCE of the first memory chip MC1 in an erase operation. The second erase voltage pass transistor SOC_GIDL, which is defined in the second memory chip MC2, may be coupled to a source plate SOURCE of the second memory chip MC2, and may transfer the erase voltage Verase to the source plate SOURCE of the second memory chip MC2 in an erase operation.

In each of the first and second memory chips MC1 and MC2, a first erase voltage pass transistor BL_GIDL and the second erase voltage pass transistor SOC_GIDL may share a drain D2, and the erase voltage Verase may be coupled to the shared drain D2.

The drain D2 of the second erase voltage pass transistor SOC_GIDL of the first memory chip MC1 and the drain D2 of the second erase voltage pass transistor SOC_GIDL of the second memory chip MC2 may be coupled in common to a line L1, and may be coupled to a peripheral circuit 140 through the line L1, which may be provided with an erase voltage Verase from the peripheral circuit 140. The drain D2, of the second erase voltage pass transistor SOC_GIDL of the first memory chip MC1, may be coupled in common to the drain D2 of the second erase voltage pass transistor SOC_GIDL of the second memory chip MC2, and thereby, may share the line L1.

A first erase enable signal EREN1 may be provided to the first memory chip MC1 from the peripheral circuit 140, and a second erase enable signal EREN2 may be provided to the second memory chip MC2 from the peripheral circuit 140. The first erase voltage pass transistor BL_GIDL and the second erase voltage pass transistor SOC_GIDL of the first memory chip MC1 may operate in response to the first erase enable signal EREN1, and the first erase voltage pass transistor BL_GIDL and the second erase voltage pass transistor SOC_GIDL of the second memory chip MC2 may operate in response to the second erase enable signal EREN2.

In an erase operation, the first and second erase voltage pass transistors BL_GIDL and SOC_GIDL of the first memory chip MC1, and the first and second erase voltage pass transistors BL_GIDL and SOC_GIDL of the second memory chip MC2, may be controlled independently to be turned on or off. As a result, the erase voltage Verase is applied to the bit lines BL and the source plate SOURCE of a memory chip including a selected memory block, but not applied to the bit lines BL and the source plate SOURCE of a memory chip not including the selected memory block.

For example, in an erase operation, in the case where a memory block included in the first memory chip MC1 is selected, and a memory block included in the second memory chip MC2 is not selected, the first erase enable signal EREN1 may be activated and the second erase enable signal EREN2 may be deactivated. Accordingly, the erase voltage Verase may be applied to the bit lines BL and the source plate SOURCE of the first memory chip MC1, and not be applied to the bit lines BL and the source plate SOURCE of the second memory chip MC2.

Figure 10:
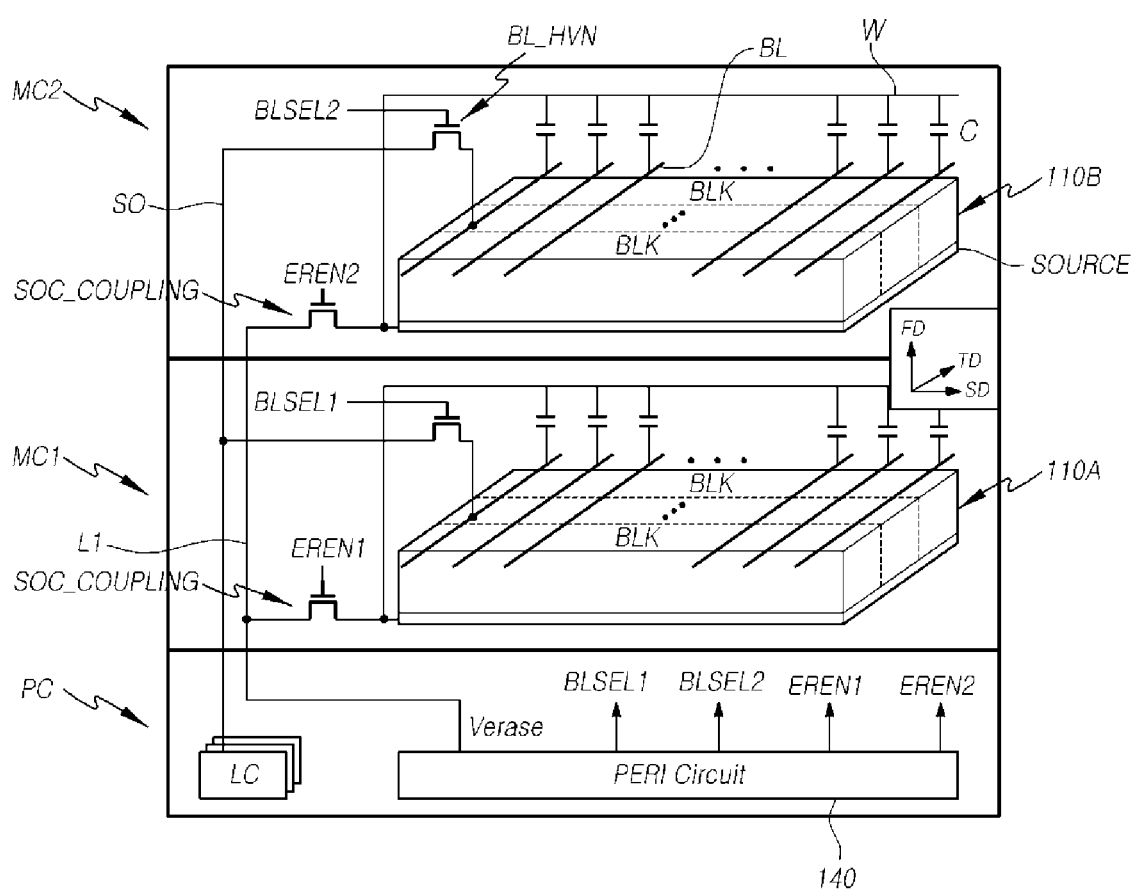

FIG. 10 is a diagram illustrating a representation of a semiconductor memory device in accordance with an embodiment of the disclosure. For the sake of simplicity in explanation, descriptions of components that are the same as those of FIGS. 4 and 7 will be omitted herein, and only differences will be described.

Referring to FIG. 10, each of first and second memory chips MC1 and MC2 may include a wiring line W that overlaps with bit lines BL. The wiring line W may overlap with the bit lines BL with a dielectric layer (not illustrated) interposed there between. In the overlapping portion between the wiring line W and each bit line BL, a coupling capacitor C may be disposed, including a first electrode configured by the wiring line W, a second electrode configured by the bit line BL and a dielectric layer configured by an insulating film between the wiring line W and the bit line BL. Each of the first and second memory chips MC1 and MC2 may include a plurality of coupling capacitors C.

A third erase voltage pass transistor SOC_COUPLING may be defined in each of the first and second memory chips MC1 and MC2. The third erase voltage pass transistor SOC_COUPLING of the first memory chip MC1 may be coupled to a source plate SOURCE and the wiring line W of the first memory chip MC1, and may transfer an erase voltage Verase to the source plate SOURCE and the wiring line W of the first memory chip MC1 in an erase operation. The third erase voltage pass transistor SOC_COUPLING of the second memory chip MC2 may be coupled to a source plate SOURCE and the wiring line W of the second memory chip MC2, and may transfer the erase voltage Verase to the source plate SOURCE and the wiring line W of the second memory chip MC2 in an erase operation.

A first erase enable signal EREN1 may be provided to the first memory chip MC1 from a peripheral circuit 140, and a second erase enable signal EREN2 may be provided to the second memory chip MC2 from the peripheral circuit 140. The third erase voltage pass transistors SOC_COUPLING of the first memory chip MC1 may operate in response to the first erase enable signal EREN1, and the third erase voltage pass transistors SOC_COUPLING of the second memory chip MC2 may operate in response to the second erase enable signal EREN2. In an erase operation, the third erase voltage pass transistor SOC_COUPLING of the first memory chip MC1 and the third erase voltage pass transistor SOC_COUPLING of the second memory chip MC2 may be independently controlled to be turned on or off. Thus, the erase voltage Verase is applied to the source plate SOURCE and the wiring line W of a memory chip including a selected memory block, and is not applied to the source plate SOURCE and the wiring line W of a memory chip not including the selected memory block.

For instance, in an erase operation, in the case where a memory block included in the first memory chip MC1 is selected and a memory block included in the second memory chip MC2 is not selected, the first erase enable signal EREN1 may be activated, and the second erase enable signal EREN2 may be deactivated. Accordingly, the erase voltage Verase may be applied to the source plate SOURCE and the wiring line W of the first memory chip MC1, and not applied to the source plate SOURCE and the wiring line W of the second memory chip MC2.

Although embodiments described with reference to FIG. 10 illustrate cases in which a bit line select transistor BL_HVN of the first memory chip MC1 and a bit line select transistor BL_HVN of the second memory chip MC2 operate in response to different bit line select signals, it is to be noted that embodiments disclosed herein are not limited thereto. As described above with reference to FIGS. 4 to 6, the bit line select transistor BL_HVN of the first memory chip MC1 and the bit line select transistor BL_HVN of the second memory chip MC2 may operate in response to the same bit line select signal.

Figure 11:
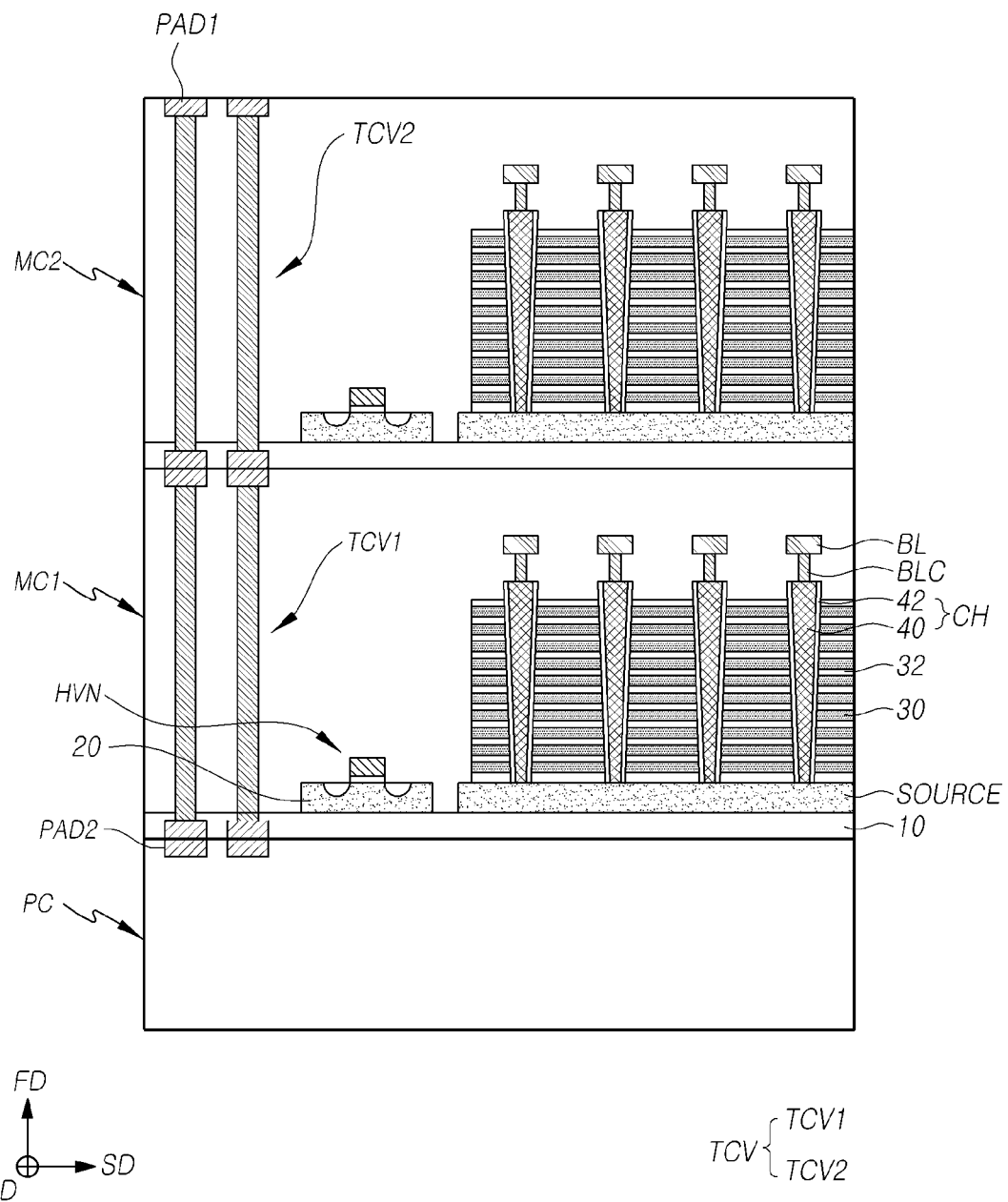
FIG. 11 is a cross-sectional view illustrating an example of a semiconductor memory device in accordance with an embodiment of the disclosure.

FIG. 11 is a cross-sectional view schematically illustrating an example of a semiconductor memory device in accordance with an embodiment of the disclosure.

Referring to FIG. 11, each of first and second memory chips MC1 and MC2 may include a source plate SOURCE, a plurality of vertical channels CH, which project from the source plate SOURCE in the first direction FD, a plurality of electrode layers 30 and a plurality of interlayer dielectric layers 32, which are alternately stacked in the first direction along the vertical channels CH, and a transistor HVN, which is defined on a semiconductor layer 20. The transistor HVN may configure one of the bit line select transistor BL_HVN and the first, second and third erase voltage pass transistors BL_GIDL, SOC_GIDL and SOC_COUPLING, which are described above and with reference to FIGS. 4 to 10.

The source plate SOURCE and the semiconductor layer 20 may be disposed on a base layer 10. The base layer 10 may be made of a dielectric material. The semiconductor layer 20 and the source plate SOURCE may be formed using the same process, and may be made of the same material. Although the present embodiment illustrates a structure in which the semiconductor layer 20 is separated from the source plate SOURCE, it is to be noted that the semiconductor layer 20 may be formed integrally with the source plate SOURCE.

The electrode layers 30 and the interlayer dielectric layers 32 may be alternately stacked on the source plate SOURCE. The electrode layers 30 may include a conductive material. For example, the electrode layers 30 may include at least one selected among a doped semiconductor (e.g., doped silicon), a metal (e.g., tungsten, copper or aluminum), a conductive metal nitride (e.g., titanium nitride or tantalum nitride) and a transition metal (e.g., titanium or tantalum). The interlayer dielectric layers 32 may include silicon oxide. At least one layer from the lowermost layer among the electrode layers 30 may configure a source select line. At least one layer from the uppermost layer among the electrode layers 30 may configure a drain select line. The electrode layers 30 between the source select line and the drain select line may configure word lines.

The vertical channels CH may be coupled to the source plate SOURCE by passing through the electrode layers 30 and the interlayer dielectric layers 32. Each of the vertical channels CH may include a channel layer 40 and a gate dielectric layer 42. The channel layer 40 may include polysilicon or monocrystalline silicon, and may include a P-type impurity such as boron (B) in some regions thereof. The gate dielectric layer 42 may have the shape of a straw or a cylindrical shell which surrounds the outer wall of the channel layer 40. The gate dielectric layer 42 may include a tunnel dielectric layer, a charge storage layer and a blocking layer which are sequentially stacked from the outer sidewall of the channel layer 40. In some embodiments, the gate dielectric layer 42 may have an ONO (oxide-nitride-oxide) stack structure in which an oxide layer, a nitride layer and an oxide layer are sequentially stacked. Source select transistors may be configured in areas or regions where the source select line surrounds the vertical channels CH. Memory cells may be configured in areas or regions where the word lines surround the vertical channels CH. Drain select transistors may be configured in areas or regions where the drain select line surrounds the vertical channels CH.

A plurality of bit lines BL may be disposed over the vertical channels CH, the electrode layers 30 and the interlayer dielectric layers 32. Bit line contacts BLC may be defined under the bit lines BL to couple the bit lines BL and the vertical channels CH.

First through-chip interconnectors TCV1, which traverse the first memory chip MC1 in the first direction FD, may be defined in the first memory chip MC1. The top end of each of the first through-chip interconnectors TCV1 may be exposed on a top surface of the first memory chip MC1, and the bottom end of each of the first through-chip interconnectors TCV1 may be exposed on a bottom surface of the first memory chip MC1.

Second through-chip interconnectors TCV2, which traverse the second memory chip MC2 in the first direction FD, may be defined in the second memory chip MC2. The top end of each of the second through-chip interconnectors TCV2 may be exposed on a top surface of the second memory chip MC2, and the bottom end of each of the second through-chip interconnectors TCV2 may be exposed on a bottom surface of the second memory chip MC2. The top and bottom ends of the first and second through-chip interconnectors TCV1 and TCV2 may be formed with or include pads PAD1.

The pads PAD1 at the bottom ends of the first through-chip interconnectors TCV1 may be bonded with pads PAD2 of a circuit chip PC. The pads PAD1 at the bottom ends of the second through-chip interconnectors TCV2 may be bonded with the pads PAD1 at the top ends of the first through-chip interconnectors TCV1. The first through-chip interconnectors TCV1 and the second through-chip interconnectors TCV2, which are disposed in a line, or aligned, in the first direction FD, may be coupled with each other to configure through-chip interconnectors TCV. The through-chip interconnectors TCV may provide routing paths that traverse the first and second memory chips MC1 and MC2 in the first direction FD. A plurality of through-chip interconnectors TCV may be defined in the first and second memory chips MC1 and MC2.

The transistor HVN of the first memory chip MC1 and the transistor HVN of the second memory chip MC2 may be coupled in common to a through-chip interconnector TCV, and may be coupled to the circuit chip PC through the through-chip interconnector TCV. If the transistor HVN is a bit line select transistor, then the through-chip interconnector TCV may configure a sensing line that couples the bit line select transistor of the first memory chip MC1 and the bit line select transistor of the second memory chips MC2 with a latch of the circuit chip PC.

FIGS. 12A to 13B are views illustrating representations of semiconductor memory devices related with the disclosure. Hereafter, the effects of the embodiments of the disclosure will be described with reference to FIGS. 12A to 13B.

Figure 12A:
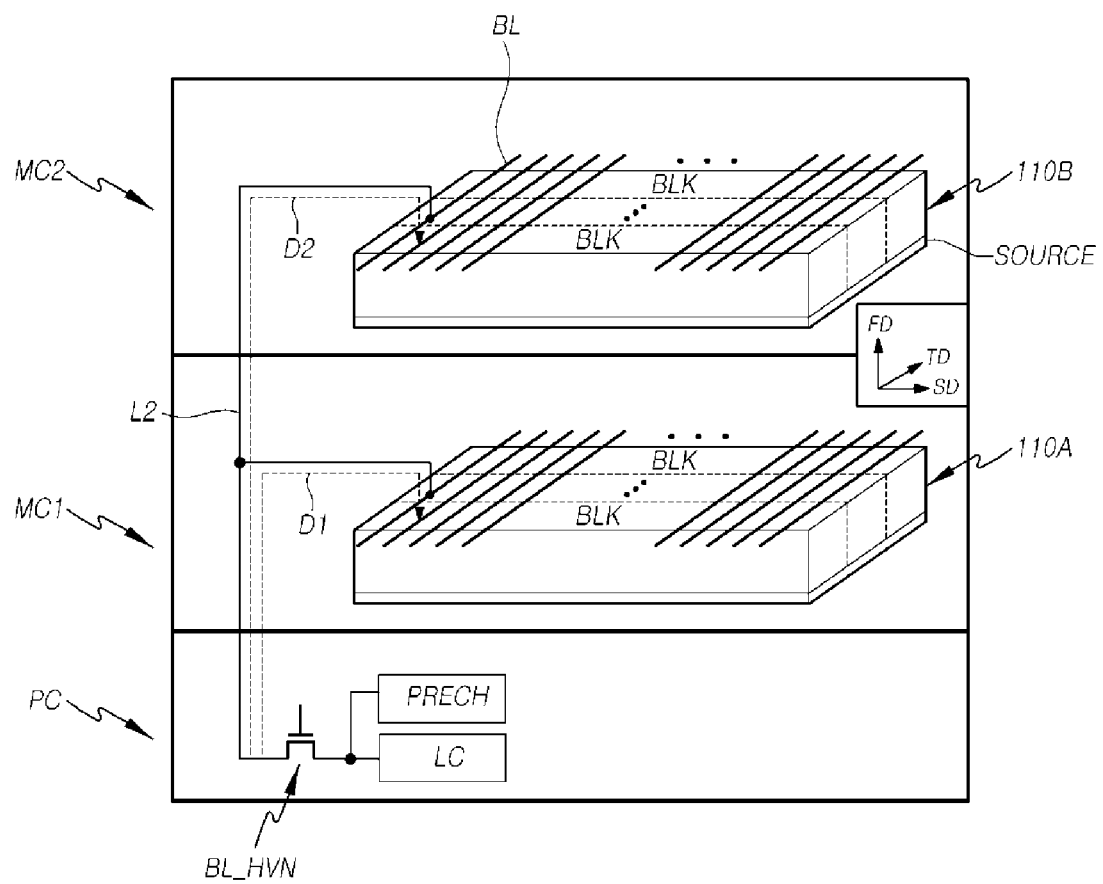
FIGS. 12A to 13B are views illustrating representations of semiconductor memory devices related with the disclosure.

Referring to FIG. 12A, a bit line select transistor BL_HVN may be defined in a circuit chip PC. A second memory chip MC2 is positioned farther away from the circuit chip PC than a first memory chip MC1. Therefore, a length D2 of a path from the bit line select transistor BL_HVN to a bit line BL of the second memory chip MC2 may be longer than a length D1 of a path from the bit line select transistor BL_HVN to a bit line BL of the first memory chip MC1.

In an operation of a semiconductor memory device such as a program or read operation, the bit line BL needs to be set to a predetermined voltage so that the operation may be performed. The unexplained reference numeral PRECH denotes a charge/discharge circuit for charging the bit line BL. Since the bit line BL acts like a resistor-capacitor (RC) circuit, it may take a time to charge or discharge the bit line BL to the predetermined voltage. If the bit line select transistor BL_HVN is turned on, charge or discharge of the bit line BL is started. Due to the difference between the lengths D1 and D2, the bit line BL of the second memory chip MC2 may be charged and discharged more slowly than the bit line BL of the first memory chip MC1, and accordingly, the memory cells of the second memory chip MC2 may be programmed or read at a speed slower than the memory cells of the first memory chip MC1.

In embodiments of the disclosure, the bit line select transistor BL_HVN is disposed in each of the first and second memory chips MC1 and MC2 to decrease or eliminate the difference between the length of a path from the bit line select transistor BL_HVN to a bit line BL of the second memory chip MC2 and the length of a path from the bit line select transistor BL_HVN to a bit line BL of the first memory chip MC1. As a result, it is possible to decrease or eliminate the difference in charge and discharge speed between the bit line BL of the first memory chip MC1 and the bit line BL of the second memory chip MC2, thereby decreasing the difference in operational speed (e.g., program speed and read speed) between a memory cell of the first memory chip MC1 and a memory cell of the second memory chip MC2.

Referring again to FIG. 12A, the bit line BL of the first memory chip MC1 and the bit line BL of the second memory chip MC2 may be coupled in common to one line L2, and may be coupled to the bit line select transistor BL_HVN defined in the circuit chip PC through the line L2. The line L2 may correspond to the through-chip interconnector TCV described above with reference to FIG. 11.

In a program operation or a read operation for a page of the first memory chip MC1, as the bit line select transistor BL_HVN is turned on, the bit line BL of the first memory chip MC1 and the bit line BL of the second memory chip MC2 may be coupled with the charge/discharge circuit PRECH. In the program or read operation, the bit line BL needs to be set to a predetermined voltage so that the operation may be performed. Since the bit line BL acts like an RC circuit, it takes a time to charge or discharge the bit line BL to the predetermined voltage. In the program or read operation for the first memory chip MC1, not only the bit line BL of the first memory chip MC1 but also the bit line BL of the second memory chip MC2 are coupled to the charge/discharge circuit PRECH. Consequently, the bit line BL of the second memory chip MC2 is charged or discharged together with the bit line BL of the first memory chip MC1, slowing the speed at which the bit line BL of the first memory chip MC1 is charged or discharged and resulting in a decrease in program and read speed.

Figure 12B:
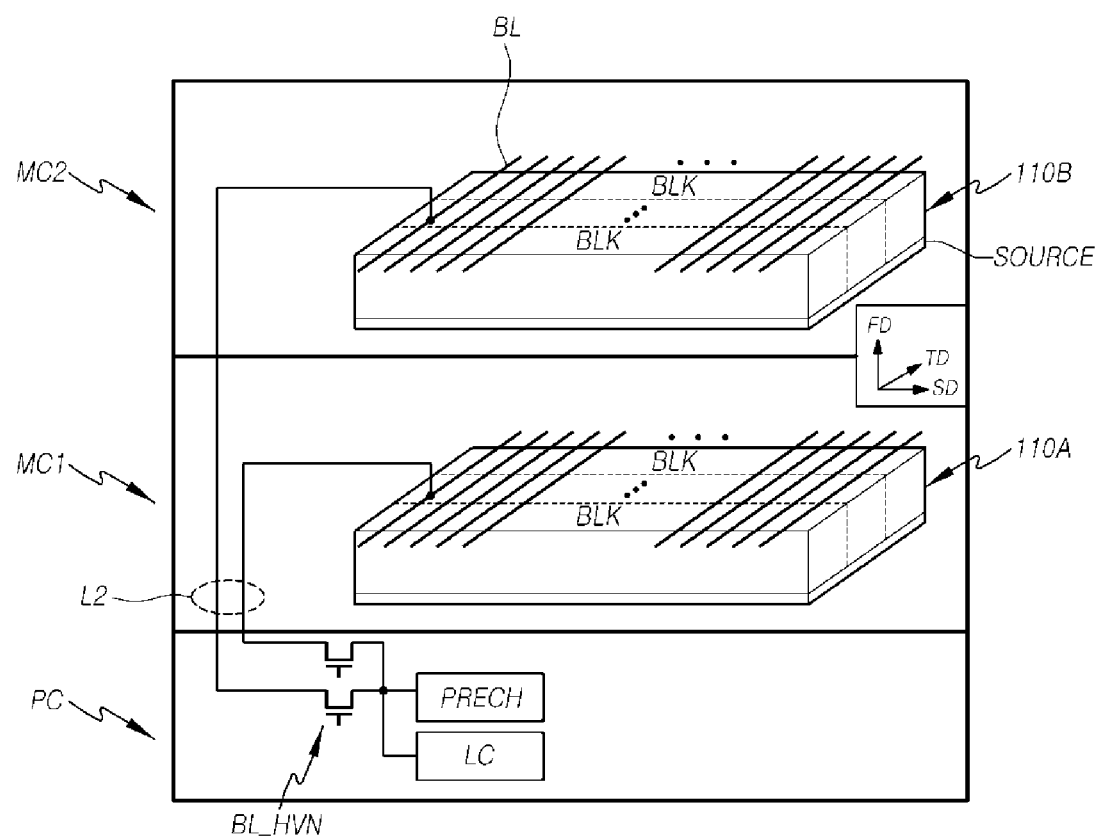

Referring to FIG. 12B, bit line select transistors BL_HVN respectively corresponding to a bit line BL of a first memory chip MC1 and a bit line BL of a second memory chip MC2 may be configured in a circuit chip PC. The number of bit line select transistors BL_HVN of the circuit chip PC may be equal to the sum of the number of bit lines BL of the first memory chip MC1 and the number of bit lines BL of the second memory chip MC2.

In a program or read operation for the first memory chip MC1, by turning off the bit line select transistors BL_HVN coupled to the bit lines BL of the second memory chip MC2, the bit lines BL of the second memory chip MC2 may be decoupled from a charge/discharge circuit PRECH. Therefore, the bit lines BL of the second memory chip MC2 are not charged or discharged, so the charge or discharge speed of the bit lines BL of the first memory chip MC1 may be improved, which improves program and read speeds.

However, lines L2 for coupling the bit line select transistors BL_HVN of the circuit chip PC to the bit lines BL of the first memory chip MC1 and to the bit lines BL of the second memory chip MC2 are needed in a number corresponding to the sum of the number of the bit lines BL of the first memory chip MC1 and the number of the bit lines BL of the second memory chip MC2. Therefore, the number of lines L2 may be about twice as large as compared to the number required in the example of FIG. 12A. The lines L2 are components that correspond to the through-chip interconnectors TCV described above with reference to FIG. 11. Thus, if the number of through-chip interconnectors TCV increases, then the manufacturing cost may rise and the size of the semiconductor memory device may increase.

According to embodiments of the disclosure, by configuring the bit line select transistors BL_HVN in the memory chips MC1 and MC2, a time required for bit lines to be charged and discharged in program and read operations may be shortened without increasing the number of the lines L2, thereby improving program and read speeds.

Figure 13A:
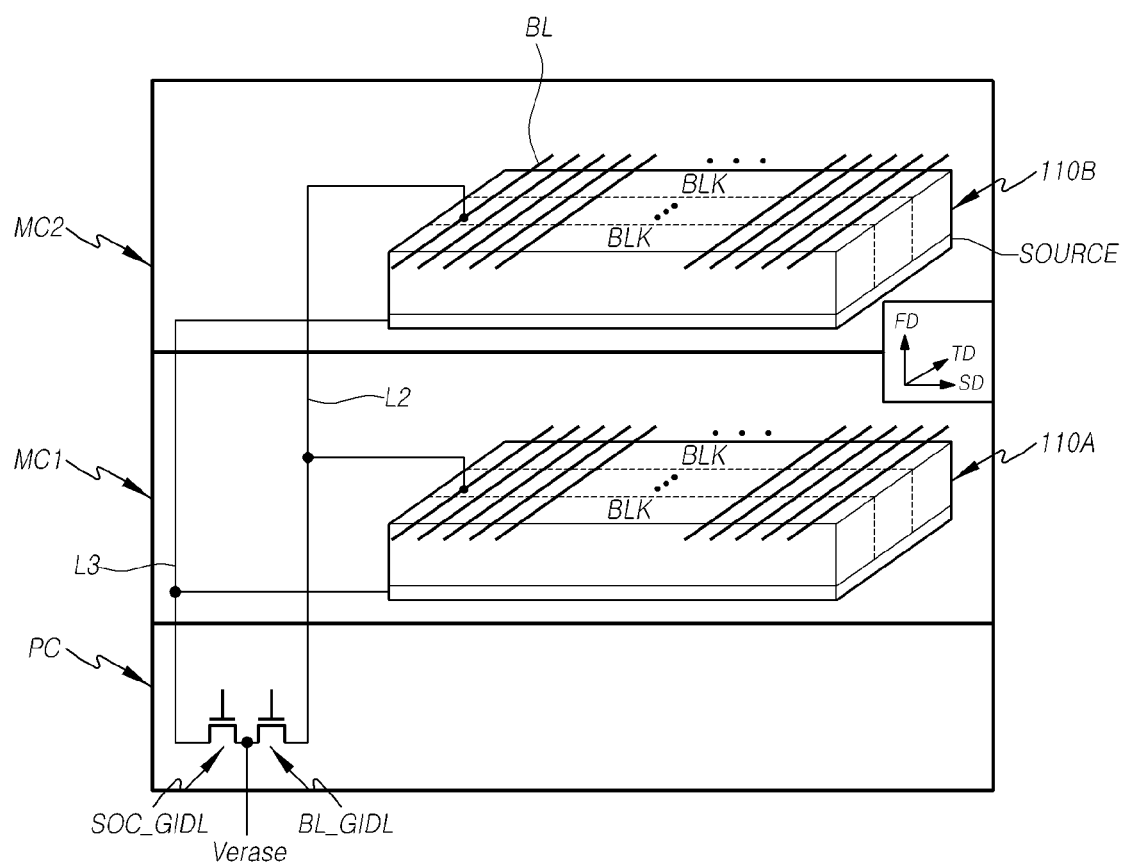

Referring to FIG. 13A, a bit line BL of a first memory chip MC1 and a bit line BL of a second memory chip MC2 may be coupled in common to one line L2, and may be coupled to a first erase voltage pass transistor BL_GIDL which is defined in a circuit chip PC through a line L2. The line L2 may correspond to a through-chip interconnector TCV described above with reference to FIG. 11.

A source plate SOURCE of the first memory chip MC1 and a source plate SOURCE of the second memory chip MC2 may be coupled in common to a line L3, and may be coupled to a second erase voltage pass transistor SOC_GIDL which is defined in the circuit chip PC through the line L3. The line L3 may correspond to a through-chip interconnector TCV described above with reference to FIG. 11.

In an erase operation for a memory block of the first memory chip MC1, the first and second erase voltage pass transistors BL_GIDL and SOC_GIDL may be turned on, and thereby, the bit line BL and the source plate SOURCE of the first memory chip MC1, and the bit line BL and the source plate SOURCE of the second memory chip MC2, may be coupled to an erase voltage Verase.

The bit line BL and the source plate SOURCE may act like RC circuits. Accordingly, it takes a time to charge or discharge the bit line BL and the source plate SOURCE to the erase voltage Verase. In an erase operation for the memory block of the first memory chip MC1, not only the bit line BL and the source plate SOURCE of the first memory chip MC1, but also the bit line BL and the source plate SOURCE of the second memory chip MC2, are coupled with the erase voltage Verase. Thus the bit line BL and the source plate SOURCE of the second memory chip MC2 are charged together, and a speed at which the bit line BL and the source plate SOURCE of the first memory chip MC1 are charged may become slower, resulting in a decrease in an erase speed.

Figure 13B:
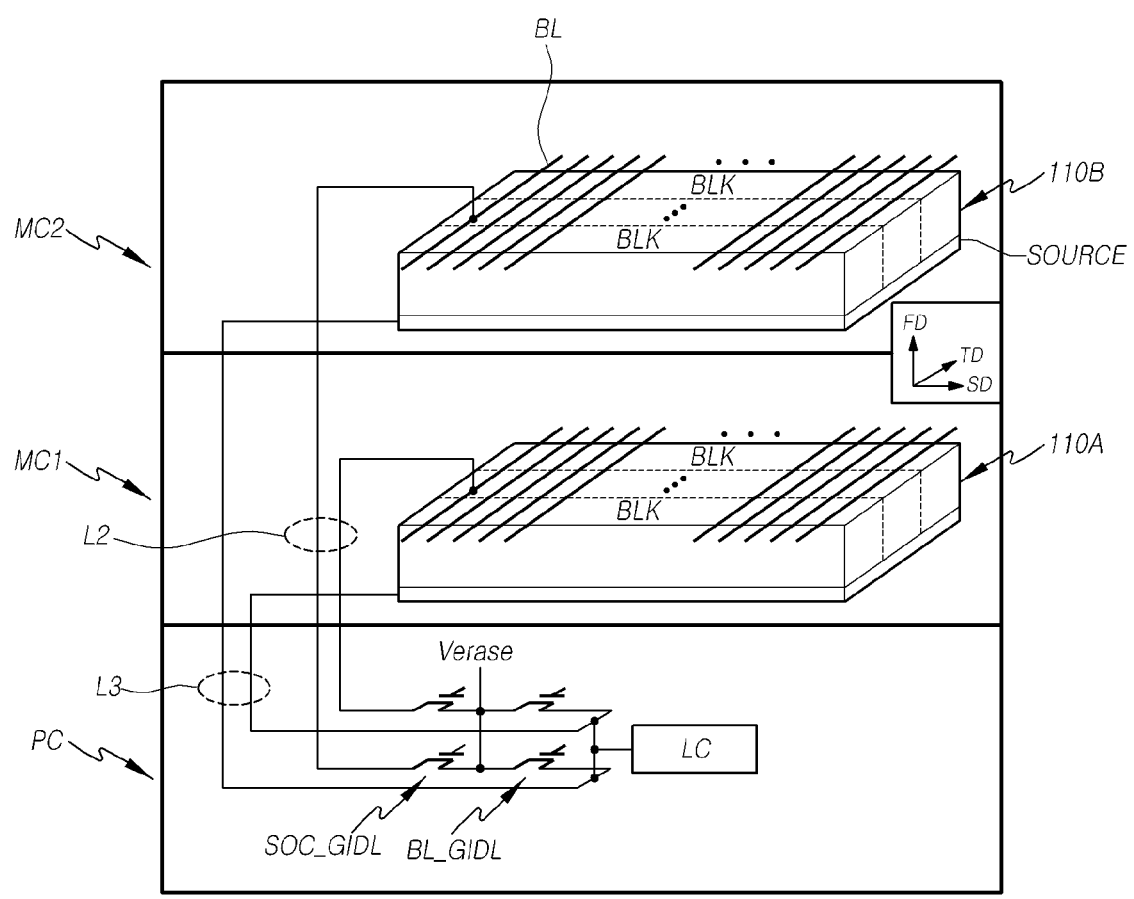

Referring to FIG. 13B, first erase voltage pass transistors BL_GIDL corresponding to a bit line BL of a first memory chip MC1 or a bit line BL of a second memory chip MC2 may be configured in a circuit chip PC, and second erase voltage pass transistors SOC_GIDL, associated with a source plate SOURCE of the first memory chip MC1 or a source plate SOURCE of the second memory chip MC2, also may be configured in the circuit chip PC.

The number of first erase voltage pass transistors BL_GIDL of the circuit chip PC may be equal to the sum of the number of bit lines BL of the first memory chip MC1 and the number of bit lines BL of the second memory chip MC2.

In an erase operation for a memory block BLK included in the first memory chip MC1, by turning on the first and second erase voltage pass transistors BL_GIDL and SOC_GIDL corresponding to the first memory chip MC1, and by turning off the first and second erase voltage pass transistors BL_GIDL and SOC_GIDL corresponding to the second memory chip MC2, the bit lines BL and the source plate SOURCE of the second memory chip MC2 may be decoupled from the erase voltage Verase. Therefore, the bit lines BL and the source plate SOURCE of the second memory chip MC2 are not charged, and the charge speed of the bit lines BL and the source plate SOURCE of the first memory chip MC1 may be improved, which in turn improves an erase speed.

However, the number of lines L2 for coupling the first erase voltage pass transistors BL_GIDL of the circuit chip PC to the bit lines BL of the first memory chip MC1 and to the bit lines BL of the second memory chip MC2 is the sum of the number of the bit lines BL of the first memory chip MC1 and the number of the bit lines BL of the second memory chip MC2, so the number may be about twice large as the number required in the example in case of FIG. 12A. The lines L2 are components that correspond to the through-chip interconnectors TCV described above with reference to FIG. 11. Thus, if the number of through-chip interconnectors TCV increases, then the manufacturing cost may rise and the size of the semiconductor memory device may increase.

According to embodiments of the disclosure, by configuring the first erase voltage pass transistors BL_GIDL in the memory chips MC1 and MC2, a time required for the bit lines BL to be charged in an erase operation may be shortened without increasing the number of the lines L2, thereby improving an erase speed.

Figure 14:
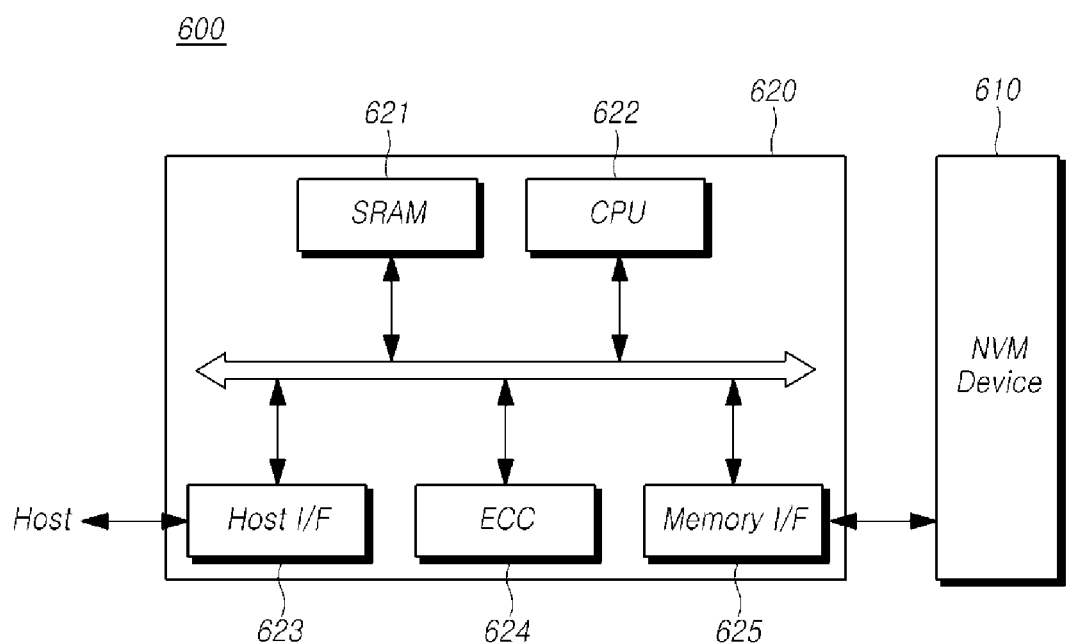
FIG. 14 is a block diagram schematically illustrating a representation of a memory system including a semiconductor memory device in accordance with an embodiment of the disclosure.

FIG. 14 is a block diagram schematically illustrating a representation of a memory system including a semiconductor memory device in accordance with an embodiment of the disclosure.

Referring to FIG. 14, a memory system 600 in accordance with an embodiment may include a nonvolatile memory device 610 and a memory controller 620.

The nonvolatile memory device 610 may be constituted by a semiconductor memory device described above and may operate in the manner described above. The memory controller 620 may be configured to control the nonvolatile memory device 610. The combination of the nonvolatile memory device 610 and the memory controller 620 may be configured as a memory card or a solid state disk (SSD). An SRAM 621 is used as a working memory of a processing unit (CPU) 622. A host interface (Host I/F) 623 includes a data exchange protocol of a host which is coupled with the memory system 600.

An error correction code block (ECC) 624 detects and corrects an error included in data read from the nonvolatile memory device 610.

A memory interface (Memory I/F) 625 interfaces with the nonvolatile memory device 610 of the present embodiment. The processing unit 622 performs general control operations for data exchange of the memory controller 620.

Although not shown in the drawing, it is obvious to a person skilled in the art to which the embodiment pertains that the memory system 600 in accordance with the embodiment may be additionally provided with a ROM which stores code data for interfacing with the host. The nonvolatile memory device 610 may be provided as a multi-chip package which is constituted by a plurality of flash memory chips.

The memory system 600 in accordance with the embodiment, described above, may be provided as a storage medium of high reliability, which has a low probability of an error to occur. In particular, the nonvolatile memory device of the present embodiment may be included in a memory system such as a solid state disk (SSD) which is being actively studied recently. In this case, the memory controller 620 may be configured to communicate with an exterior (for example, the host) through one of various interface protocols such as a USB (universal serial bus) protocol, an MMC (multimedia card) protocol, a PCI-E (peripheral component interconnection express) protocol, an SATA (serial advanced technology attachment) protocol, a PATA (parallel advanced technology attachment) protocol, an SCSI (small computer system interface) protocol, an ESDI (enhanced small disk interface) protocol and an IDE (Integrated Device Electronics) protocol.

Figure 15:
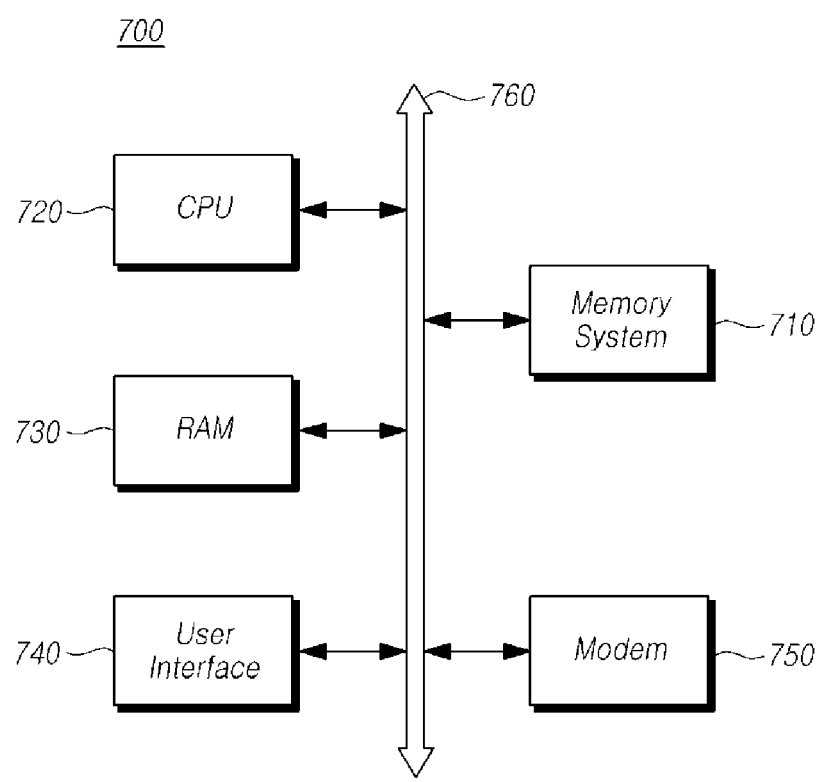
FIG. 15 is a block diagram schematically illustrating a representation of a computing system including a semiconductor memory device in accordance with an embodiment of the disclosure.

FIG. 15 is a block diagram schematically illustrating of a computing system including a semiconductor memory device in accordance with an embodiment of the disclosure.

Referring to FIG. 15, a computing system 700 in accordance with an embodiment may include a memory system 710, a microprocessor (CPU) 720, a RAM 730, a user interface 740 and a modem 750 such as a baseband chipset, which are electrically coupled to a system bus 760. In the case where the computing system 700 in accordance with the embodiment is a mobile device, a battery (not shown) for supplying the operating voltage of the computing system 700 may be additionally provided. Although not shown in the drawing, it is obvious to a person skilled in the art to which the embodiment pertains that the computing system 700 in accordance with the embodiment may be additionally provided with an application chipset, a camera image processor (CIS), a mobile DRAM, and so on. The memory system 710 may configure, for example, an SSD (solid state drive/disk) which uses a nonvolatile memory to store data. Otherwise, the memory system 710 may be provided as a fusion flash memory (for example, an OneNAND flash memory).

Although exemplary embodiments of the disclosure have been described for illustrative purposes, those skilled in the art will appreciate that various modifications, additions and substitutions are possible, without departing from the scope and spirit of the disclosure. Therefore, the embodiments disclosed above and in the accompanying drawings should be considered in a descriptive sense only and not for limiting the technological scope. The technological scope of the disclosure is not limited by the embodiments and the accompanying drawings. The spirit and scope of the disclosure may be interpreted in connection with the appended claims and encompass all equivalents falling within the scope of the appended claims.

What is claimed is:

1. A semiconductor memory device comprising:
   a latch defined on a circuit chip;
   a bit line select transistor defined in a first memory chip stacked on the circuit chip; and
   a bit line select transistor defined in a second memory chip stacked on the first memory chip,
   wherein the bit line select transistors exchange data with the latch,
   wherein each of the first and second memory chips further includes:
   a coupling capacitor including a bit line, a wiring line that overlaps with the bit line and a dielectric layer disposed between the bit line and the wiring line; and
   a first erase voltage pass transistor coupled to a source plate and the wiring line, and configured to transfer an erase voltage to the source plate and the wiring line in an erase operation.

2. The semiconductor memory device according to claim 1, wherein the bit line select transistor of the first memory chip and the bit line select transistor of the second memory chip share a through-chip interconnector disposed to traverse the stacked first and second memory chips.

3. The semiconductor memory device according to claim 1, wherein the bit line select transistor of the first memory chip and the bit line select transistor of the second memory chip are controlled to be simultaneously turned on or off.

4. The semiconductor memory device according to claim 1, wherein the bit line select transistor of the first memory chip and the bit line select transistor of the second memory chip are controlled to be individually turned on or off.

5. The semiconductor memory device according to claim 1,
wherein each of the first and second memory chips includes a memory cell array coupled between the bit line and the source plate, and
wherein each of the memory cell arrays includes a plurality of memory blocks in which data are stored and is coupled to the first memory chip or the second memory chip, and
wherein each of the first and second memory chips further includes a second erase voltage pass transistor coupled to the bit line to apply the erase voltage to the bit line in the erase operation.

6. The semiconductor memory device according to claim 5, wherein the second erase voltage pass transistor of the first memory chip and the second erase voltage pass transistor of the second memory chip are controlled to be individually turned on or off in the erase operation, and
wherein the erase voltage is applied to the bit line of a memory chip including a selected memory block and the erase voltage is not applied to the bit line of a memory chip not including the selected memory block.

7. The semiconductor memory device according to claim 1, wherein each of the first and second memory chips further includes a third erase voltage pass transistor coupled to the source plate that applies the erase voltage to the source plate in the erase operation.

8. The semiconductor memory device according to claim 7, wherein the third erase voltage pass transistor of the first memory chip and the third erase voltage pass transistor of the second memory chip are controlled to be individually turned on or off, and
wherein, in the erase operation, the erase voltage is applied to the source plate of a memory chip including a selected memory block and the erase voltage is not applied to the source plate of a memory chip not including the selected memory block.

9. The semiconductor memory device according to claim 1, wherein the first erase voltage pass transistor of the first memory chip and the first erase voltage pass transistor of the second memory chip are controlled to be individually turned on or off, and
wherein, in the erase operation, the erase voltage is applied to the source plate and the wiring line of a memory chip including a selected memory block, and the erase voltage is not applied to the source plate and the wiring line of a memory chip that does not include the selected memory block.

10. A semiconductor memory device comprising:
a bit line select transistor defined in each of a first and a second memory chip, which are stacked on a circuit chip;
a through-chip interconnector traversing the first and second memory chips, and coupled in common to the bit line select transistor of the first memory chip and the bit line select transistor of the second memory chip; and
a latch defined in the circuit chip and, through the through-chip interconnector, coupled to the bit line select transistor of the first memory chip and the bit line select transistor of the second memory chip,
wherein each of the first and second memory chips further includes:
a coupling capacitor including a bit line, a wiring line that overlaps with the bit line and a dielectric layer disposed between the bit line and the wiring line; and
a first erase voltage pass transistor coupled to a source plate and the wiring line, and configured to transfer an erase voltage to the source plate and the wiring line in an erase operation.

11. The semiconductor memory device according to claim 10, wherein the bit line select transistor of the first memory chip and the bit line select transistor of the second memory chip are controlled to be individually turned on or off.

12. The semiconductor memory device according to claim 10,
wherein each of the first and second memory chips includes a memory cell array coupled between the bit line and the source plate,
wherein each of the memory cell arrays includes a plurality of memory blocks in which data are stored and is coupled to the bit line select transistor, and
wherein each of the first and second memory chips further includes a second erase voltage pass transistor coupled to the bit line to apply the erase voltage to the bit line in the erase operation.

13. The semiconductor memory device according to claim 12, wherein the second erase voltage pass transistor of the first memory chip and the second erase voltage pass transistor of the second memory chip are controlled to be individually turned on or off, and
wherein, in the erase operation, the erase voltage is applied to the bit line of a memory chip including a selected memory block and the erase voltage is not applied to the bit line of a memory chip not including the selected memory block.

14. The semiconductor memory device according to claim 12, wherein each of the first and second memory chips further includes a third erase voltage pass transistor coupled to the source plate to apply the erase voltage to the source plate in the erase operation.

15. The semiconductor memory device according to claim 14, wherein the third erase voltage pass transistor of the first memory chip and the third erase voltage pass transistor of the second memory chip are controlled to be individually turned on or off, and
wherein, in the erase operation, the erase voltage is applied to the source plate of a memory chip including a selected memory block and the erase voltage is not applied to the source plate of a memory chip not including the selected memory block.

16. The semiconductor memory device according to claim 10, wherein the first erase voltage pass transistor of the first memory chip and the first erase voltage pass transistor of the second memory chip are controlled to be individually turned on or off, and
wherein, in the erase operation, the erase voltage is applied to the source plate and the wiring line of a memory chip including a selected memory block, and the erase voltage is not applied to the source plate and the wiring line of a memory chip that does not include the selected memory block.

17. A semiconductor memory device comprising:
low-voltage elements of a page buffer circuit defined on a circuit chip; and
high-voltage elements of the page buffer circuit defined in each of a first memory chip and a second memory chip stacked on the circuit chip,
wherein each of the first and second memory chips includes:
a coupling capacitor including a bit line, a wiring line that overlaps with the bit line and a dielectric layer disposed between the bit line and the wiring line; and
an erase voltage pass transistor coupled to a source plate and the wiring line, and configured to transfer an erase voltage to the source plate and the wiring line in an erase operation.

18. The semiconductor memory device according to claim 17,
wherein each of the first and second memory chips includes a memory cell array coupled between the bit line and the source plate,
wherein each of the memory cell arrays is coupled to a bit line select transistor and includes a plurality of memory blocks in which data are stored, and
wherein each of the first and second memory chips further includes an erase circuit, connected to at least one of the bit line and the source plate, which transfers the erase voltage to at least one of the bit line and the source plate in the erase operation.

* * * * *